US012761681B2

(12) United States Patent
Choi et al.

(10) Patent No.: US 12,761,681 B2
(45) Date of Patent: Oct. 13, 2026

(54) LOW DROPOUT REGULATOR AND MEMORY DEVICE INCLUDING THE SAME

(71) Applicant: SAMSUNG ELECTRONICS CO., LTD., Suwon-si (KR)

(72) Inventors: Junhan Choi, Suwon-si (KR); Jaewoo Park, Suwon-si (KR); Myoungbo Kwak, Suwon-si (KR); Jinook Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 161 days.

(21) Appl. No.: 18/760,350

(22) Filed: Jul. 1, 2024

(65) Prior Publication Data

US 2025/0060769 A1 Feb. 20, 2025

(30) Foreign Application Priority Data

Aug. 18, 2023 (KR) ........................ 10-2023-0108539
Oct. 23, 2023 (KR) ........................ 10-2023-0142340

(51) Int. Cl.

| | |
|---|---|
| ***G11C 5/14*** | (2006.01) |
| ***G05F 1/565*** | (2006.01) |
| ***G05F 1/575*** | (2006.01) |
| ***G11C 11/4074*** | (2006.01) |

(52) U.S. Cl.

CPC .............. *G05F 1/575* (2013.01); *G05F 1/565* (2013.01); *G11C 5/143* (2013.01); *G11C 5/147* (2013.01); *G11C 11/4074* (2013.01); *G11C 5/14* (2013.01)

(58) Field of Classification Search

CPC ......... G05F 1/575; G05F 1/565; G11C 5/147; G11C 11/4074

See application file for complete search history.

(56) References Cited

U.S. PATENT DOCUMENTS

| | | | | |
|---|---|---|---|---|
| 8,471,538 | B2 | 6/2013 | Pancholi et al. | |
| 9,746,864 | B1 | 8/2017 | Narang et al. | |
| 10,078,342 | B2 | 9/2018 | Kossel | |
| 10,152,072 | B1 | 12/2018 | Elhebeary et al. | |
| 10,324,481 | B2 | 6/2019 | Dahl | |
| 10,591,938 | B1 * | 3/2020 | Golara | G05F 1/575 |
| 10,866,607 | B1 * | 12/2020 | Avci | G01S 7/484 |
| 11,003,202 | B2 | 5/2021 | Golara | |
| 11,416,014 | B2 * | 8/2022 | Kadanka | G05F 1/613 |
| 11,467,614 | B2 | 10/2022 | Wang et al. | |
| 11,480,986 | B2 | 10/2022 | Golara | |
| 11,940,830 | B2 | 3/2024 | Jung et al. | |
| 2010/0074034 | A1 * | 3/2010 | Cazzaniga | G11C 16/30 323/275 |
| 2015/0234404 | A1 * | 8/2015 | Agarwal | G05F 1/575 323/273 |

(Continued)

*Primary Examiner* — Mushfique Siddique
(74) *Attorney, Agent, or Firm* — Fish & Richardson P.C.

(57) ABSTRACT

An example low dropout (LDO) regulator includes a voltage regulating circuit and an adaptive biasing circuit. The voltage regulating circuit is configured to regulate an output voltage of an output node connected with a load by using the output voltage as first feedback. The adaptive biasing circuit is configured to generate a biasing signal that supports regulation of the output voltage by using a sensing signal in an internal node of the voltage regulating circuit as second feedback, and to provide the biasing signal to the voltage regulating circuit.

19 Claims, 21 Drawing Sheets

(56) References Cited

U.S. PATENT DOCUMENTS

| | | | | |
|---|---|---|---|---|
| 2016/0161961 | A1* | 6/2016 | El-Nozahi | G05F 1/56 323/280 |
| 2017/0199537 | A1* | 7/2017 | Duong | G05F 1/575 |
| 2018/0120874 | A1* | 5/2018 | Chen | G05F 1/56 |
| 2021/0225423 | A1* | 7/2021 | Moon | G11C 11/4074 |
| 2021/0397207 | A1* | 12/2021 | Joo | H02M 1/08 |
| 2022/0103142 | A1 | 3/2022 | Gruber et al. | |
| 2022/0302089 | A1* | 9/2022 | Rusu | H10W 90/00 |
| 2022/0350357 | A1* | 11/2022 | Shashwat | G05F 1/565 |

* cited by examiner

LOW DROPOUT REGULATOR AND MEMORY DEVICE INCLUDING THE SAME

CROSS-REFERENCE TO RELATED APPLICATIONS

This application claims priority under 35 U.S.C. § 119 to Korean Patent Application Nos. 10-2023-0108539 and 10-2023-0142340, filed on Aug. 18, 2023 and Oct. 23, 2023, respectively, in the Korean Intellectual Property Office, the disclosures of which are incorporated by reference herein in their entirety.

BACKGROUND

A low dropout (LDO) regulator is configured to constantly provide an output voltage at a target level to a load. When a great amount of load current is introduced at once in the direction of the load due to an operation of the load, the output voltage may rapidly drop. In this case, the LDO regulator may regulate the output voltage in a method of negative feedback such that the output voltage that has dropped may reach the target level.

Recently, due to high-rate operation of memory devices or electronic devices corresponding to loads to which LDO regulators provide output voltages, load currents rapidly change, and therefore, research has been actively conducted on LDO regulators promptly responding to the change of the load currents.

SUMMARY

The present disclosure relates to a low dropout (LDO) regulator configured to stably provide an output voltage at a target level to a memory device or an electronic device operating at a high rate.

In some implementations, an LDO regulator includes a voltage regulating circuit configured to regulate an output voltage of an output node connected to a load by using the output voltage as first feedback and an adaptive biasing circuit configured to generate a biasing signal for supporting regulation of the output voltage by using a sensing signal in an internal node of the voltage regulating circuit as second feedback and provide the biasing signal to the voltage regulating circuit.

In some implementations, an LDO regulator includes a first node connected to a load and configured to provide an output voltage, an LDO current source connected between a second node and a ground and driving a sink current, a first current mirror including a first transistor and a second transistor each connected to a power voltage terminal through a source terminal and connected to the second node through a gate terminal, a third transistor sharing the first node with a drain terminal of the first transistor through a source terminal and connected to the second node through the drain terminal, a comparator configured to output a result of comparing the output voltage of the first node with a reference voltage to a gate terminal of the third transistor, and an adaptive biasing circuit configured to generate an additional current flowing from the second node to the ground, based on a sensing signal corresponding to a voltage of the second node and complement the sink current.

In some implementations, a memory device includes a buffer die and a plurality of core dies vertically stacked on the buffer die and connected to the buffer die through a plurality of through silicon vias (TSVs), wherein the buffer die includes a first driving circuit configured to generate first output data from first input data and output the first output data to a first TSV among the plurality of TSVs and a first LDO regulator configured to provide a first output voltage of a first output node to the first driving circuit as a supply voltage, wherein the first LDO regulator includes a first voltage regulating circuit configured to regulate the first output voltage of the first output node based on the first output voltage and a first adaptive biasing circuit configured to generate a first biasing signal for supporting regulation of the first output voltage based on a first sensing signal in a first internal node of the first voltage regulating circuit.

BRIEF DESCRIPTION OF THE DRAWINGS

Implementations will be more clearly understood from the following detailed description taken in conjunction with the accompanying drawings.

DETAILED DESCRIPTION

Figure 1:
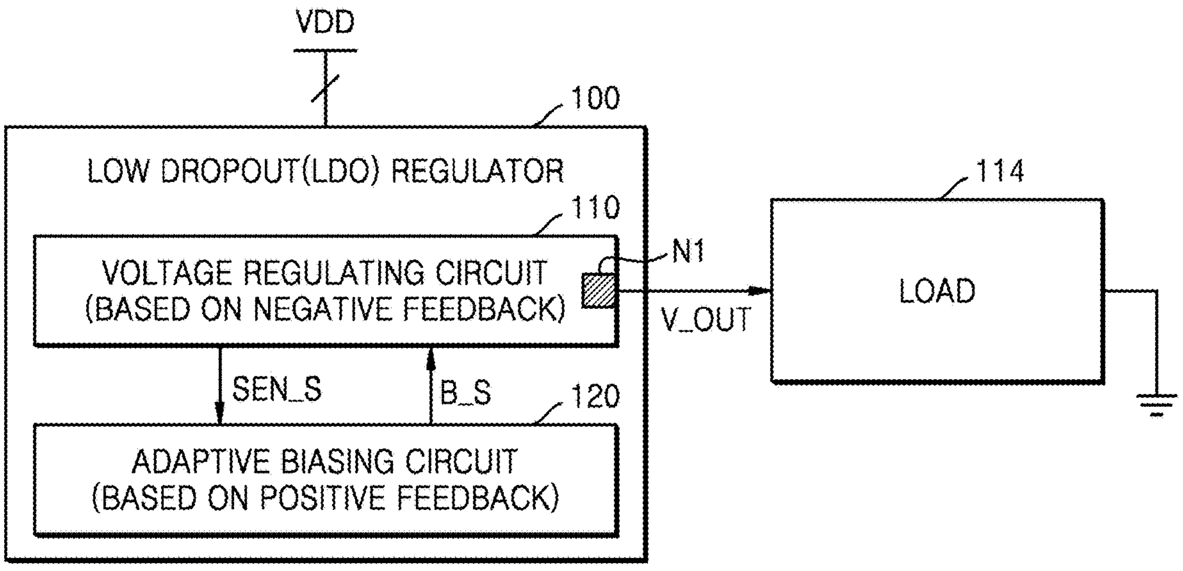
FIG. 1 is a block diagram schematically illustrating an example of a low dropout (LDO) regulator.

FIG. 1 is a block diagram schematically illustrating an example of a low dropout (LDO) regulator 100. FIG. 1 illustrates the LDO regulator 100 including only necessary components for describing the present disclosure, and implementations of the LDO regulator 100 may also be applied to various integrated circuits configured to provide an output voltage to a load 114.

Referring to FIG. 1, the LDO regulator 100 may include a voltage regulating circuit 110 and an adaptive biasing circuit 120. The load 114 may include semiconductor circuits manufactured through integration in a memory device or a semiconductor die. For example, the load 114 may correspond to any one of a high bandwidth memory (HBM), a central processing unit (CPU), a graphics processing unit (GPU), a system on chip, a memory controller, a display controller, and the like. In addition, according to functions, areas, and design methods of the load 114, the load 114 may be connected to at least one other LDO regulator to which the present disclosure is applied, in addition to an LDO regulator, and may receive an output voltage.

In some implementations, the voltage regulating circuit 110 may be configured to provide an output voltage V_OUT to the load 114 through a first node N1. In the present specification, the first node N1 may be referred to as an output node, and the output voltage V_OUT may be referred to as a supply voltage. The voltage regulating circuit 110 may be configured to use the output voltage V_OUT as first feedback and adjust the output voltage V_OUT to maintain a target level. More particularly, when the output voltage V_OUT drops in accordance with increase in the amount of a load current introduced into the load 114, the voltage regulating circuit 110 may be configured to adjust the output voltage V_OUT based on negative feedback such that the output voltage V_OUT is recovered to the target level. In addition, even when the output voltage V_OUT increases in accordance with decrease in the amount of the load current introduced into the load 114, the voltage regulating circuit 110 may be configured to regulate the output voltage V_OUT based on the negative feedback such that the output voltage V_OUT is recovered to the target level.

In some implementations, the adaptive biasing circuit 120 may be configured to generate a biasing signal B_S for supporting regulation with respect to the output voltage V_OUT of the voltage regulating circuit 110, by using a sensing signal at an internal node of the voltage regulating circuit 110 as second feedback, and may provide the biasing signal B_S to the voltage regulating circuit 110. In some implementations, the biasing signal B_S generated by the adaptive biasing circuit 120 may also be understood as a biasing signal for accurate and stable operations of a transistor that is directly engaged in the regulation with respect to the output voltage V_OUT of the voltage regulating circuit 110.

In some implementations, the adaptive biasing circuit 120 may be connected to the internal node of the voltage regulating circuit 110, may generate a sensing signal based on a voltage of the internal node, and may generate the biasing signal B_S based on positive feedback using the sensing signal. For example, the sensing signal SEN_S may include a signal related to a current corresponding to the load current flowing to the load 114. As another example, the biasing signal B_S may include a signal for complementing a sink current flowing to a ground of the voltage regulating circuit 110.

Furthermore, in some implementations, the adaptive biasing circuit 120 may be configured to limit a positive feedback operation such that a negative feedback operation of the voltage regulating circuit 110 to regulate the output voltage V_OUT is smoothly performed. That is, the adaptive biasing circuit 120 may be configured to limit influences of the positive feedback on the output voltage V_OUT compared with the negative feedback of the voltage regulating circuit 110.

In FIG. 1, to clearly indicate the present disclosure, components of the LDO regulator 100 are distinguished as the voltage regulating circuit 110 and the adaptive biasing circuit 120. However, this is only an example and the implementation is not limited thereto, and the LDO regulator 100 may be variously implemented as an integrated circuit configured to perform all operations of the voltage regulating circuit 110 and the adaptive biasing circuit 120.

The LDO regulator 100 according to some implementations may be configured to regulate the output voltage V_OUT based on the negative feedback and at the same time, may also be configured to support a regulation operation with respect to the output voltage V_OUT based on the positive feedback such that the transistor configured to perform the negative feedback operation may accurately and stably operate. By doing so, the LDO regulator 100 may be configured to stably provide the output voltage V_OUT having the target level to the load 114, which operates at a high rate.

Figure 2:
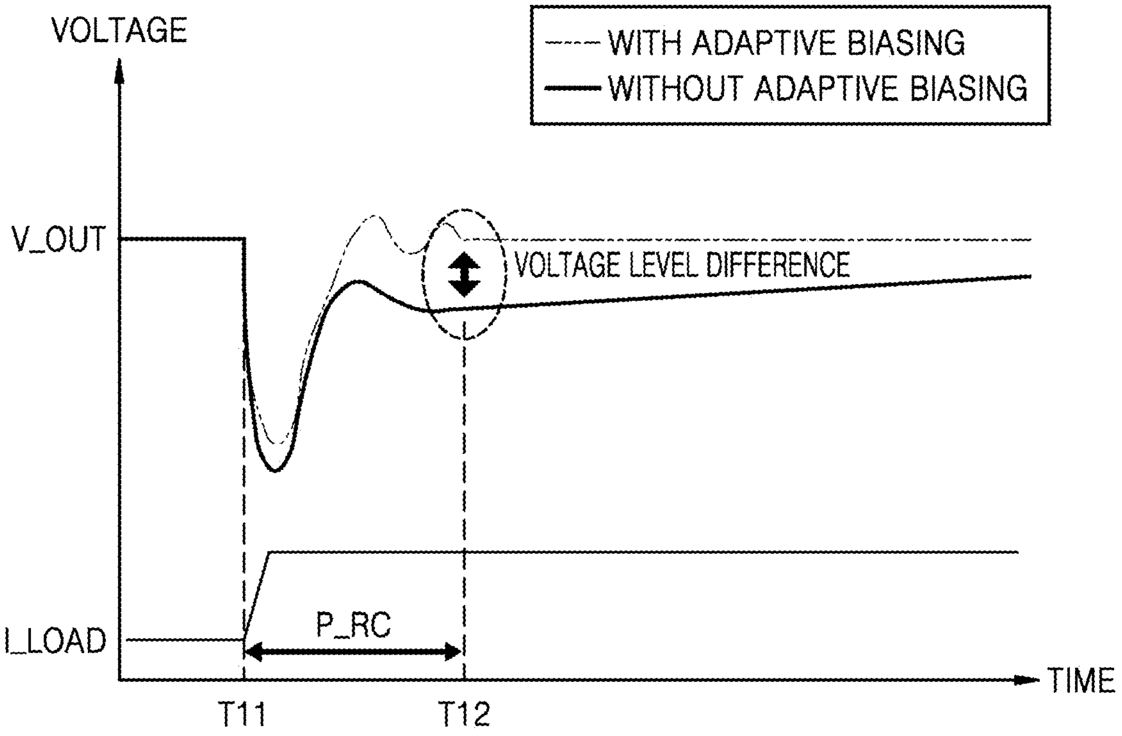
FIG. 2 is a diagram for describing an example of an operation of the LDO regulator illustrated in FIG. 1.

FIG. 2 is a diagram for describing an example of an operation of the LDO regulator 100 illustrated in FIG. 1.

Referring to FIGS. 1 and 2, the output voltage V_OUT may drop as the load current I_LOAD introduced into the load 114 increases from a first level to a second level. The voltage regulating circuit 110 of the LDO regulator 100 may be configured to adjust the output voltage V_OUT such that the output voltage V_OUT is recovered to the target level in a recovery period P_RC between time T11 and time T21 in response to the output voltage V_OUT that has dropped. In addition, the adaptive biasing circuit 120 of the LDO regulator 100 may be configured to generate the biasing signal B_S for supporting a regulation operation with respect to the output voltage V_OUT of the voltage regulating circuit 110, and by doing so, the output voltage V_OUT may be precisely recovered to the target level.

There may be a difference between voltage levels of the output voltage V_OUT after the recovery period P_RC when no adaptive biasing is applied to an LDO regulator in a comparative example and when adaptive biasing is applied to the LDO regulator 100 in some implementations of the present disclosure.

Figure 3A:
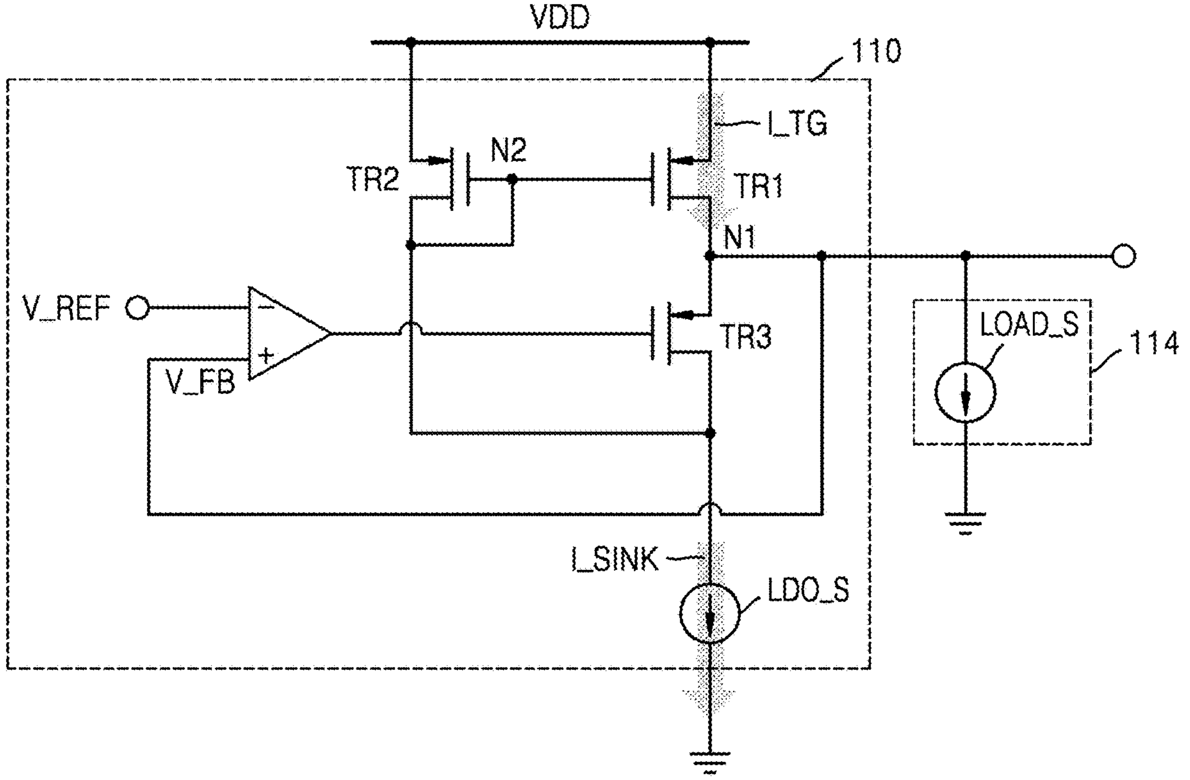
FIG. 3A is a circuit diagram illustrating an example of a voltage regulating circuit illustrated in FIG. 1.
Figure 3B:
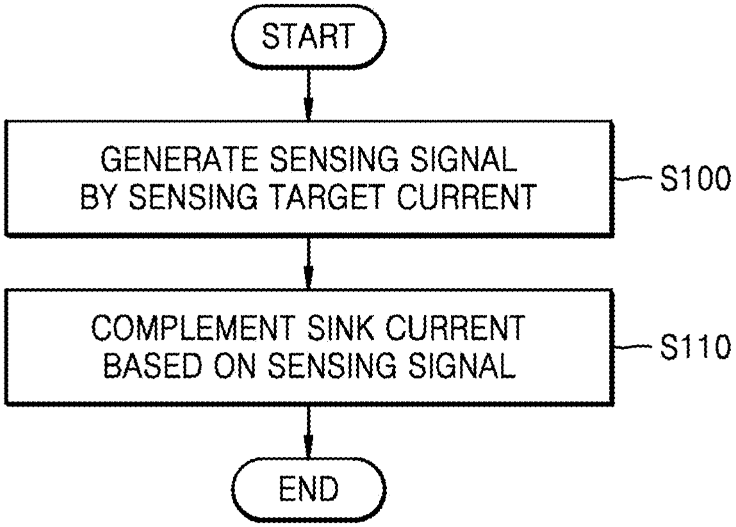
FIG. 3B is a flowchart illustrating operations of an example of an adaptive biasing circuit illustrated in FIG. 1.

FIG. 3A is a circuit diagram illustrating an example of the voltage regulating circuit 110 illustrated in FIG. 1, and FIG. 3B is a flowchart illustrating operations of an example of the adaptive biasing circuit 120 illustrated in FIG. 1.

Referring to FIG. 3A, the voltage regulating circuit 110 may include a first transistor TR1, a second transistor TR2, a third transistor TR3, an LDO current source LDO_S, and a comparator 111. In addition, the load 114 may include a load current source LOAD_S, and a current flowing due to the load current source LOAD_S may correspond to the load current. The LDO current source LDO_S may include a tail current having an arbitrary or a preset level.

In some implementations, the first transistor TR1, the second transistor TR2, and the third transistor TR3 may each include a p-channel metal-oxide-semiconductor (PMOS) transistor or a n-channel metal-oxide-semiconductor (NMOS) transistor. Hereinafter, each of the first transistor TR1, the second transistor TR2, and the third transistor TR3 includes a PMOS transistor, but the present disclosure is not limited thereto. In addition, the first transistor TR1, the second transistor TR2, and the third transistor TR3 may be connected to one another to operate as flipped voltage followers. Hereinafter, a particular connection structure of the voltage regulating circuit 110 is described.

The first transistor TR1 may be connected to a power voltage VDD terminal through a source terminal, connected to the first node N1 node, i.e., an output node N1, through a drain terminal, and may be connected to a second node N2 through a gate terminal. The second transistor TR2 may be connected to the power voltage VDD terminal through a source terminal, and may be connected to the second node N2 through a gate terminal and a drain terminal. The first transistor TR1 and the second transistor TR2 may share the second node N2 through the gate terminals. The first transistor TR1 and the second transistor TR2 may construct a first current mirror. For example, a current flowing through a channel of the first transistor TR1 may include a current copied from a current flowing through a channel of the second transistor TR2. The third transistor TR3 may be connected to the first node N1 through a source terminal and connected to the second node N2 through a drain terminal. The third transistor TR3 may share the first node N1 with the first transistor TR1 through the source terminal. The comparator 111 may be configured to compare a reference voltage V_REF with a feedback voltage V_FB that corresponds to the output voltage of the first node N1 and output a result of the comparison to the gate terminal of the third transistor TR3. In the present specification, the feedback voltage V_FB may also be referred to as feedback. In some implementations, the comparator 111 may be implemented as an operational amplifier.

Based on the structure illustrated in FIG. 3A, the voltage regulating circuit 110 may be configured to regulate the output voltage of the first node N1 by a negative feedback method by using the feedback voltage V_FB. Hereinafter, operations of the adaptive biasing circuit 120 (see FIG. 1) are described.

In some implementations, the adaptive biasing circuit 120 (see FIG. 1) may be configured to generate a sensing signal by sensing a target current I_TG that is proportional to the load current. That is, the adaptive biasing circuit 120 (see FIG. 1) may be configured to perform an adaptive biasing operation by sensing increase in the target current I_TG. In the present specification, the adaptive biasing operation may be understood as an operation for supporting an operation of the voltage regulating circuit 110 to regulate the output voltage.

In some implementations, the adaptive biasing circuit 120 (see FIG. 1) may be configured to complement the sink current I_SINK by generating the biasing signal B_S (see FIG. 1) in response to the increase in the target current I_TG and providing the biasing signal B_S to the voltage regulating circuit 110. More particularly, the adaptive biasing circuit 120 (see FIG. 1) may be configured to generate the biasing signal B_S that is proportional to the target current I_TG and provide the biasing signal B_S to the voltage regulating circuit 110 as an additional current. In the present specification, the sink current I_SINK, i.e., a current flowing from the second node N2 to the ground, may be defined as a total current of the current flowing due to the LDO current source LDO_S and the additional current generated by the adaptive biasing circuit 120 (see FIG. 1). In addition, in the present specification, complementing of the sink current I_SINK may include regulating the additional current included in the sink current I_SINK. Hereinafter, operations of the adaptive biasing circuit 120 (see FIG. 1) are clearly described.

Further referring to FIG. 3B, in operation S100, the adaptive biasing circuit 120 (see FIG. 1) may be configured to generate the sensing signal by sensing the target current I_TG. In operation S110, the adaptive biasing circuit 120 (see FIG. 1) may be configured to complement the sink current I_SINK based on the sensing signal generated in operation S100.

Referring again to FIG. 3A, the target current I_TG increases in accordance with the increase in the load current, which causes decrease in the amount of a current flowing through a channel of the third transistor TR3, and as a result thereof, a gate-source voltage of the third transistor TR3 decreases, and thus, operations of the third transistor TR3 may be interfered. To prevent the aforementioned problem, the adaptive biasing circuit 120 (see FIG. 1) may generate the additional current increasing in accordance with the increase in the target current I_TG and complement the sink current I_SINK to increase, to thereby prevent beforehand the decrease in the current flowing through the channel of the third transistor TR3. More particularly, a current flowing from the first node N1 to the second node N2 through the channel of the third transistor TR3 may be maintained in a threshold range in the recovery period P_RC in accordance with the drop of the output voltage V_OUT in FIG. 2. Accordingly, the third transistor TR3 may smoothly operate even when the load current increases, and the output voltage of the first node N1 may be rapidly recovered to the target level.

Figure 4:
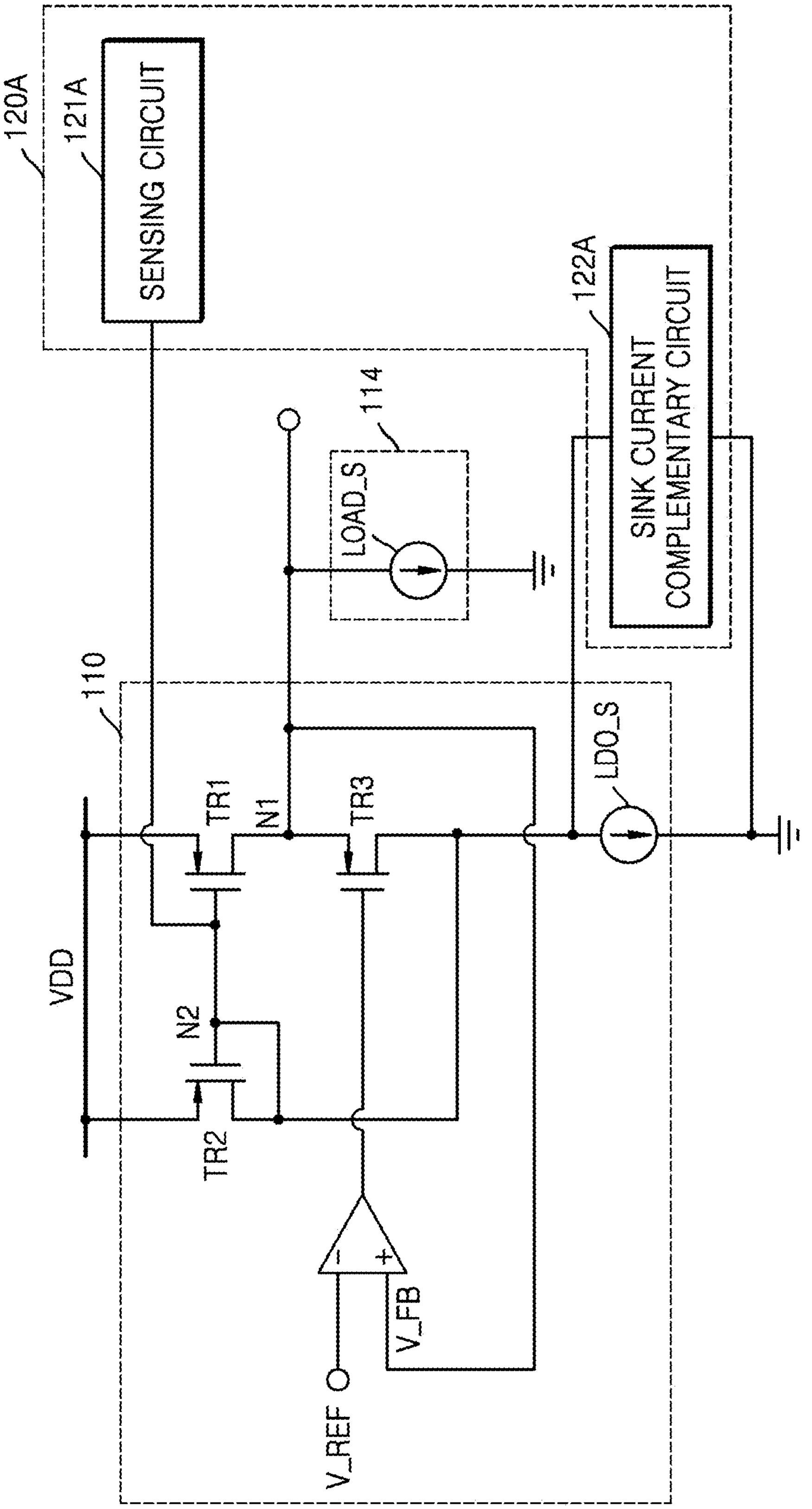
FIG. 4 is a diagram schematically illustrating an example of an adaptive biasing circuit.

FIG. 4 is a diagram schematically illustrating an example of an adaptive biasing circuit 120A. It is assumed that the voltage regulating circuit 110 shown in FIG. 4 and the voltage regulating circuit 110 are implemented in the same configuration, and the same descriptions as those given with reference to FIG. 3A are omitted.

Referring to FIG. 4, the adaptive biasing circuit 120A may include a sensing circuit 121A and a sink current complementary circuit 122A.

In some implementations, the sensing circuit 121A may be connected to the second node N2 of the voltage regulating circuit 110 and may sense a voltage of the second node N2. The second node N2 may correspond to the internal node of the voltage regulating circuit 110 described with reference to FIG. 1 and the like. As the voltage of the second node N2 is proportional to the target current I_TG illustrated in FIG. 3A, the sensing circuit 121A may be configured to indirectly sense the target current I_TG through sensing the voltage of the second node N2. The sensing circuit 121A may be configured to generate a sensing signal by sensing the voltage of the second node N2 and provide the sensing signal to the sink current complementary circuit 122A.

In some implementations, the sink current complementary circuit 122A may be configured to generate an additional current based on the sensing signal and provide the additional current to the voltage regulating circuit 110. The sink current may be complemented as the additional current generated in the sink current complementary circuit 122A is added to the current flowing due to the LDO current source LDO_S.

Figure 5:
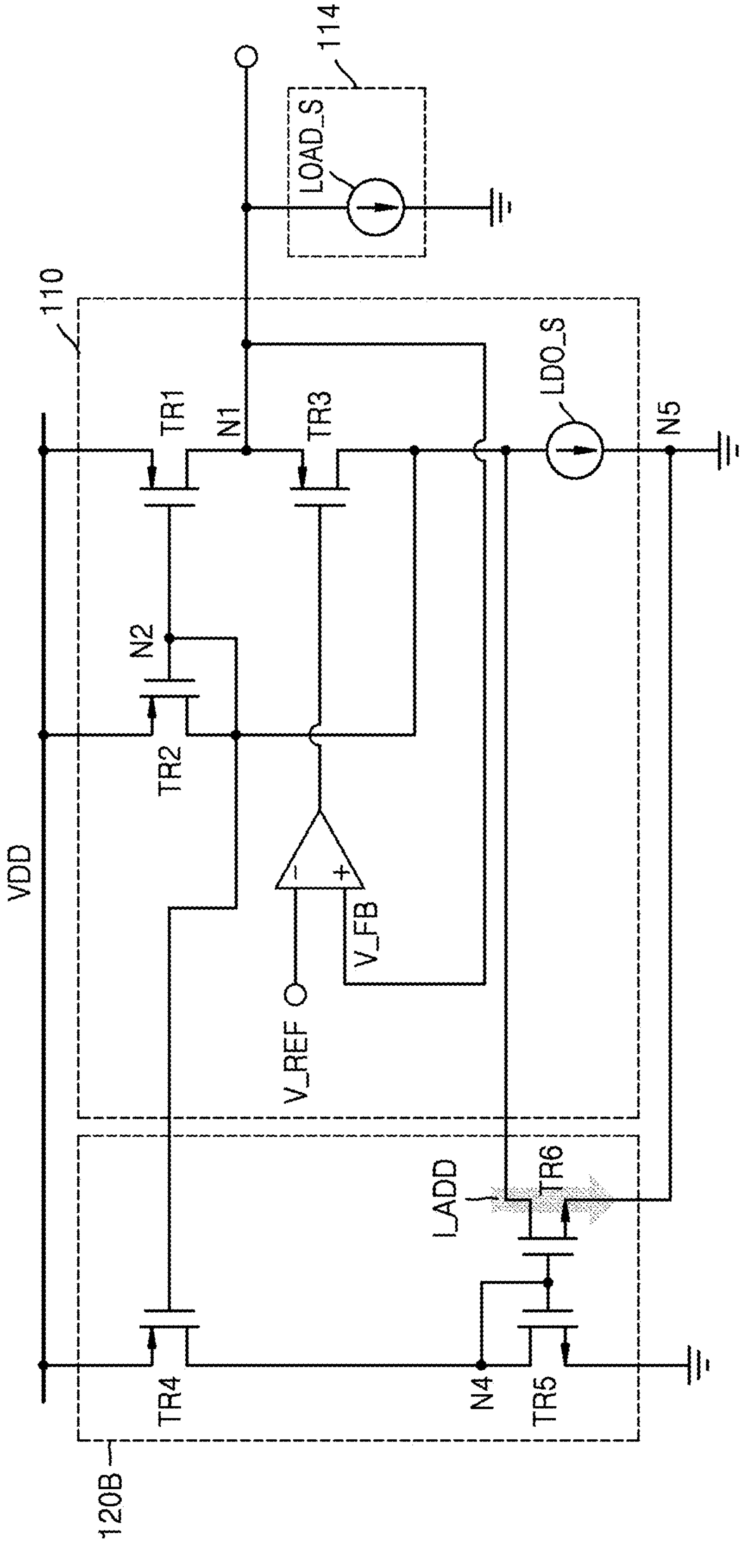
FIG. 5 is a circuit diagram illustrating an example of an adaptive biasing circuit.

FIG. 5 is a circuit diagram illustrating an example of an adaptive biasing circuit 120B. It is assumed that the voltage regulating circuit 110 illustrated in FIG. 5 and the voltage regulating circuit 110 illustrated in FIG. 3A are implemented in the same configuration, and the same descriptions as those given with reference to FIG. 3A are omitted.

Referring to FIG. 5, the adaptive biasing circuit 120B may include a fourth transistor TR4, a fifth transistor TR5, and a sixth transistor TR6.

In some implementations, each of the fourth transistor TR4, the fifth transistor TR5, and the sixth transistor TR6 may include a PMOS transistor or an NMOS transistor. Hereinafter, an implementation in which the fourth transistor TR4 includes a PMOS transistor while each of the fifth transistor TR5 and the sixth transistor TR6 includes an NMOS transistor is mainly described, but the present disclosure is not limited thereto. Hereinafter, a particular connection structure of the adaptive biasing circuit 120B is described.

The fourth transistor TR4 may be connected to the power voltage VDD terminal through a source terminal, connected to the second node N2 through a gate terminal, and connected to a fourth node N4 through a drain terminal. The fifth transistor TR5 may be grounded through a drain terminal and may be connected to the fourth node N4 through a gate terminal and the drain terminal.

The sixth transistor TR6 may be connected to the second node N2 through a drain terminal, connected to the fourth node N4 through a gate terminal, and connected to a fifth node N5 through a source terminal. The sixth transistor TR6 may be connected in parallel with the LDO current source LDO_S through the source terminal and the drain terminal. The fifth transistor TR5 and the sixth transistor TR6 may share the fourth node N4 through the gate terminals. The fifth transistor TR5 and the sixth transistor TR6 may construct a second current mirror. For example, a current flowing through the channel of the sixth transistor TR6 may include a current copied from a current flowing through a channel of the fifth transistor TR5.

In some implementations, a current that varies according to the voltage of the second node N2 may flow through a channel of the fourth transistor TR4. For example, when the voltage of the second node N2 increases, the current flowing through the fourth transistor TR4 may increase and flow to the fifth transistor TR5. The current may correspond to the aforementioned sensing signal. The current may flow from the fourth node N4 in the channel of the fifth transistor TR5 to ground. Thereafter, the current may include the reference current, and a current copied from the reference current may flow, as an additional current I_ADD, from the second node N2 to the fifth node N5 (or ground) in the channel of the sixth transistor TR6.

In some implementations, the adaptive biasing circuit 120B may be configured to generate the additional current I_ADD by performing a positive feedback operation by using the voltage of the second node N2. The additional current I_ADD may be proportional to the voltage of the second node N2.

The additional current I_ADD may be defined by [Equation 1] as follows:

$$I\_ADD = \frac{\frac{W6}{L6}}{\frac{W5}{L5}} X\ I\_REF \qquad \text{[Equation 1]}$$

'I_REF' corresponds to the aforementioned reference current, which flows from the fourth transistor TR4 to the fifth transistor TR5, 'W5' corresponds to a width of the fifth transistor TR5, and 'L5' corresponds to the length of the fifth transistor TR5. In addition, 'W6' corresponds to the width of the sixth transistor TR6 and 'L6' corresponds to the length of the sixth transistor TR6.

The magnitude of the additional current I_ADD compared with the reference current I_REF may be set based on [Equation 1]. In some implementations, the width W5 and the length L5 of the fifth transistor TR5 and the width W6 and the length L6 of the sixth transistor TR6 may also be designed such that the positive feedback operation of the adaptive biasing circuit 120B is not interfered by the negative feedback operation of the voltage regulating circuit 110. Detailed implementations thereof are described below.

Figure 6:
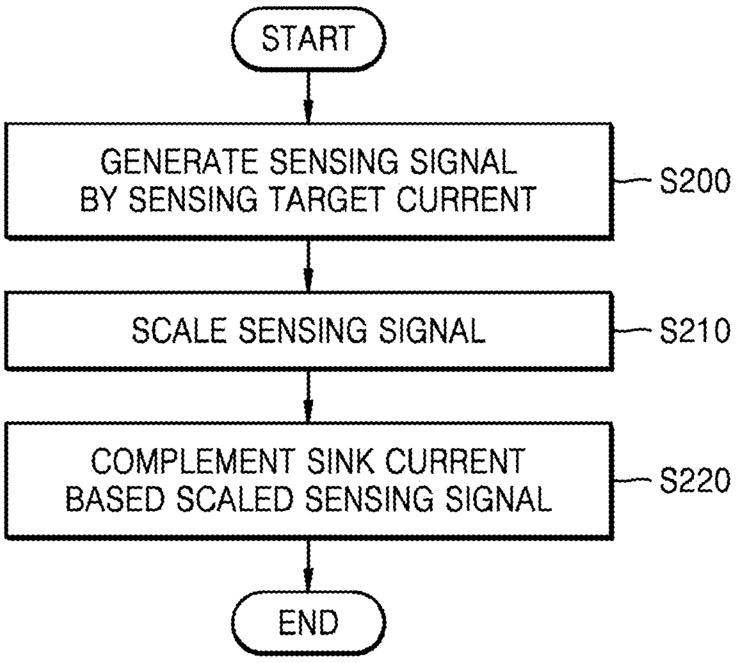
FIG. 6 is a flowchart illustrating operations of an example of an adaptive biasing circuit.

FIG. 6 is a flowchart illustrating operations of an example of an adaptive biasing circuit.

Referring to FIG. 6, in operation S200, the adaptive biasing circuit may be configured to generate a sensing signal by sensing a target current of a voltage regulating circuit. In some implementations, the adaptive biasing circuit may be configured to generate a sensing signal by sensing a voltage of an internal node of a voltage regulating circuit.

In operation S210, the adaptive biasing circuit may be configured to scale the sensing signal generated in operation S200. In some implementations, the adaptive biasing circuit may be configured to limitedly apply the positive feedback operation of the adaptive biasing circuit by downscaling the sensing signal according to a preset scaling ratio.

In operation S220, the adaptive biasing circuit may be configured to complement the sink current based on the sensing signal that has been scaled in operation S210. In some implementations, the adaptive biasing circuit may be configured to generate the additional current based on the scaled sensing signal and complement the sink current by providing the additional current to the voltage regulating circuit.

Figure 7:
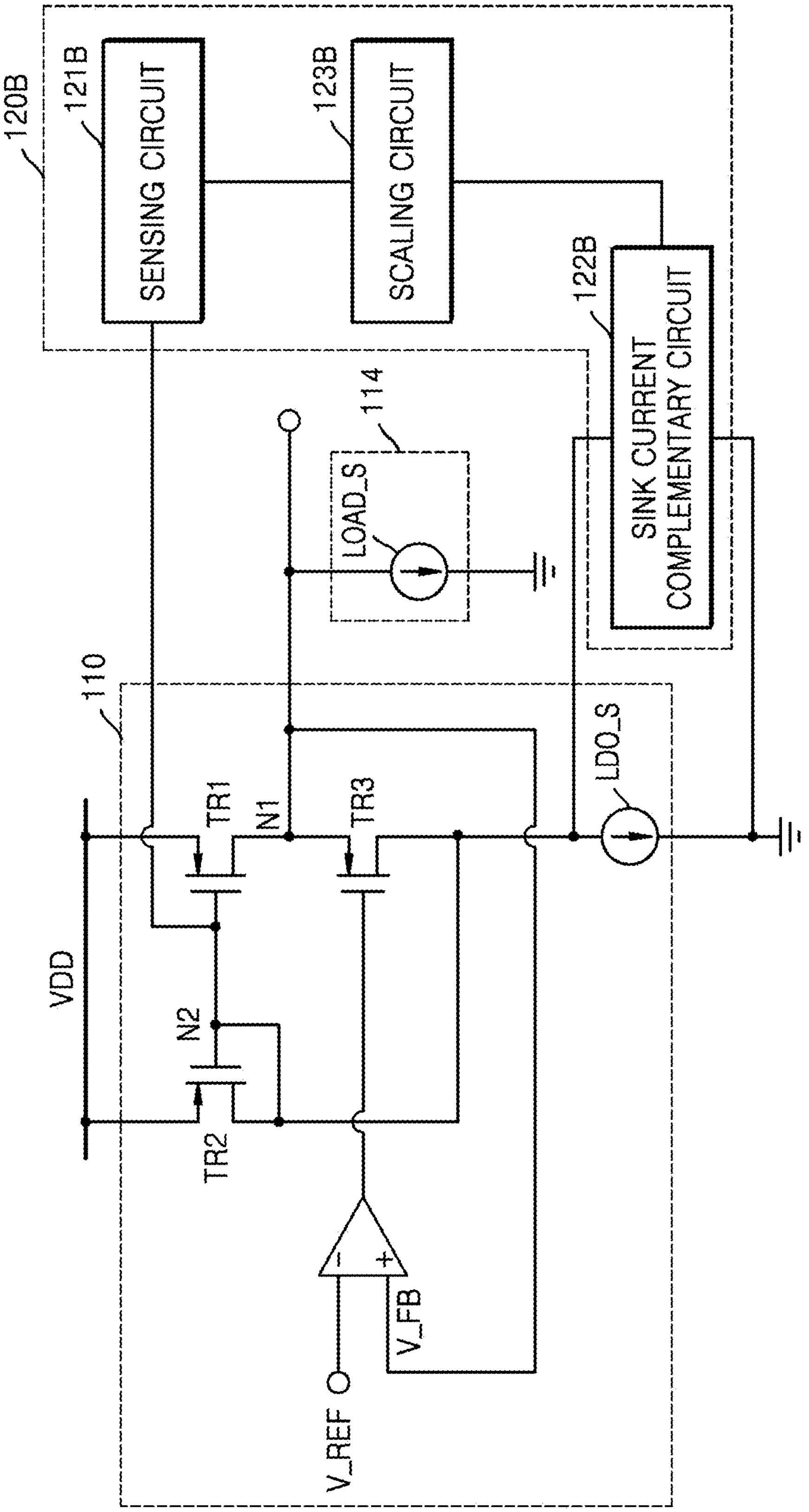
FIG. 7 is a diagram schematically illustrating an example of an adaptive biasing circuit.

FIG. 7 is a diagram schematically illustrating an example of an adaptive biasing circuit 120C. It is assumed that the voltage regulating circuit 110 illustrated in FIG. 7 and the voltage regulating circuit 110 illustrated in FIG. 3A are implemented in the same configuration, and the same descriptions as those given with reference to FIG. 3A are omitted.

Referring to FIG. 7, the adaptive biasing circuit 120C may include a sensing circuit 121C, a scaling circuit 123C, and a sink current complementary circuit 122C.

In some implementations, the sensing circuit 121C may be configured to generate a sensing signal by sensing the voltage of the second node N2 of the voltage regulating circuit 110 and provide the sensing signal to the scaling circuit 123C.

In some implementations, the scaling circuit 123C may be configured to downscale the sensing signal according to a scaling ratio. The scaling ratio may include a value that has been preset and fixed or a value that adaptively varies according to the output voltage of the first node N1. In some implementations, the scaling circuit 123C may be configured to determine a scaling ratio based on variation of the sensing signal corresponding to variation of the output voltage of the first node N1 and perform scaling on the sensing signal by using the determined scaling ratio.

In some implementations, the scaling ratio may be set as at least one value based on characteristics of the load 114. In the present specification, the scaling ratio may correspond to a first parameter that is used when the adaptive biasing circuit 120C generates a biasing signal. In some implementations, the load 114 may include a driving circuit, which is configured to generate output data from input data, and a via configured to deliver the output data of the driving circuit. Furthermore, in some implementations, the characteristics of the load 114 may include at least one of the characteristics of the driving circuit and the characteristics of the via.

In some implementations, the scaling circuit 123C may be configured to perform a scaling operation on the sensing signal by fixedly using a scaling ratio having a preset value. In some implementations, the scaling circuit 123C may also be configured to perform a scaling operation on the sensing signal by using a scaling ratio that adaptively has any one of preset values. The scaling circuit 123C may be configured to provide the scaled sensing signal to the sink current complementary circuit 122C.

In some implementations, the sink current complementary circuit 122C may be configured to complement the sink current flowing from the second node N2 of the voltage regulating circuit 110 to ground based on the scaled sensing signal. More particularly, the sink current complementary circuit 122C may be configured to complement the sink current by generating an additional current that corresponds to the biasing signal, based on the scaled sensing signal, and having the additional current flow from the second node N2 to ground.

By appropriately designing the fifth transistor TR5 and the sixth transistor TR6 and regulating the magnitude of the additional current I_ADD to be less than the magnitude of the reference current I_REF, without including the scaling circuit 123C shown in FIG. 7, the same effects as in the operation of scaling the sensing signal may be acquired.

Figure 8A:
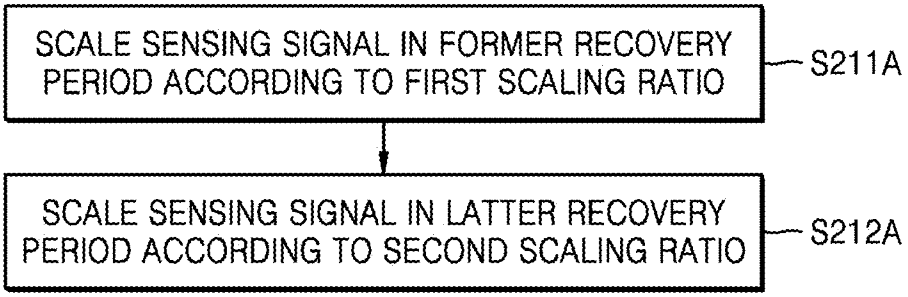
FIGS. 8A and 8B are flowchart illustrating operations of an example of an adaptive biasing circuit.
Figure 8B:
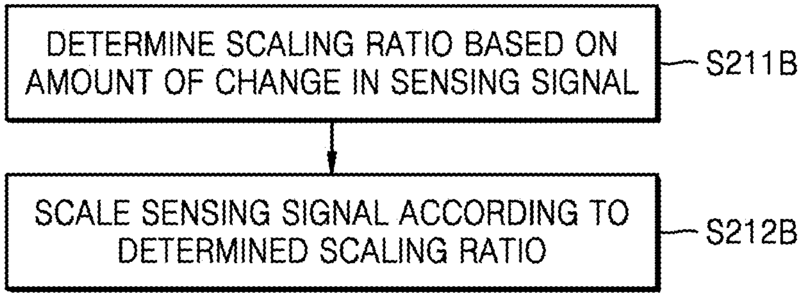

FIGS. 8A and 8B are flowchart illustrating operations of an example of an adaptive biasing circuit.

Referring to FIG. 8A, in operation S211A, the adaptive biasing circuit may be configured to scale a sensing signal in a former recovery period at a first scaling ratio.

In operation S212A, the adaptive biasing circuit may be configured to scale a sensing signal, in a latter recovery period following the former recovery period, at a second scaling period.

Further referring to FIG. 2, in the recovery period P_RC, a period between the time T11 and a middle time may correspond to the former recovery period, and a period between the middle time and the time T21 may correspond to the latter recovery period. In the former recovery period, in which the output voltage V_OUT that has rapidly dropped is to be rapidly recovered, the negative feedback operation of the voltage regulating circuit is important, and thus it may be required to minimize influences of the positive feedback operation by the adaptive biasing circuit. Next, in the latter recovery period, it is important that the output voltage V_OUT is accurately recovered to the target level, and thus, it may be required to increase influences of the positive feedback operation by the adaptive biasing circuit.

Accordingly, the first scaling ratio of operation S211A may be less than the second scaling ratio of operation S212A. A sensing signal scaled according to the first scaling ratio may be less than a sensing signal scaled according to the second scaling ratio.

Although an implementation in which the recovery period P_RC is divided into two periods, i.e., the former recovery period and the latter recovery period, and different scaling ratios are applied to the periods is described with reference to FIG. 8A, the embodiment is not limited thereto, and the recovery period P_RC may be further divided, and different scale ratios may be applied to period obtained by the division.

Further referring to FIG. 8B, in operation S211B, the adaptive biasing circuit may be configured to determine a scaling ratio based on the amount of change in the sensing signal.

In operation S212B, the adaptive biasing circuit may be configured to scale the sensing signal according to the scaling ratio determined in operation S211B.

Figure 9:
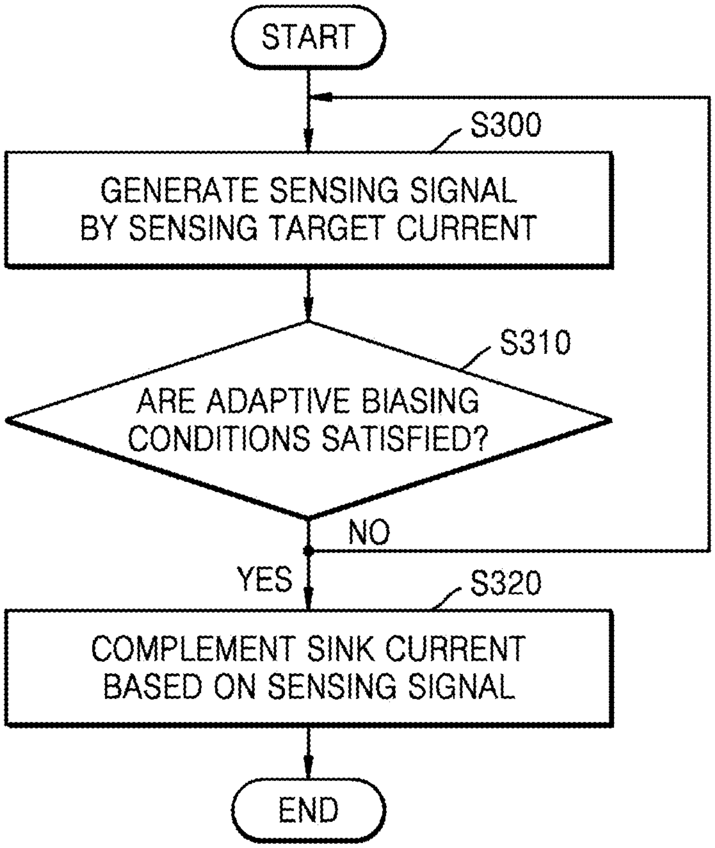
FIG. 9 is a flowchart illustrating operations of an example of an adaptive biasing circuit.

FIG. 9 is a flowchart illustrating operations of an example of an adaptive biasing circuit.

Referring to FIG. 9, in operation S300, the adaptive biasing circuit may be configured to generate a sensing signal by sensing a target signal of the voltage regulating circuit. As described above, the adaptive biasing circuit may be configured to generate the sensing signal by sensing the voltage of the internal node (e.g., the second node N2 illustrated in FIG. 5) of the voltage regulating circuit.

In operation S310, the adaptive biasing circuit may be configured to determine whether the sensing signal satisfies adaptive biasing conditions based on the sensing signal. In some implementations, the adaptive biasing circuit may be configured to perform an operation to complement the sink current only when certain adaptive biasing conditions are satisfied, to thereby limit influences on the output voltage of the positive feedback compared with the negative feedback of the voltage regulating circuit. In some implementations, the adaptive biasing conditions may be variously set under conditions that the negative feedback operation of the voltage regulating circuit and the positive feedback operation of the adaptive biasing circuit may be most properly performed with synergy. For example, the adaptive biasing conditions may include conditions under which the sensing signal corresponds to the low frequency band.

When operation S310 is 'YES', continuously in operation S320, the adaptive biasing circuit may be configured to complement the sink current of the voltage regulating circuit based on the sensing signal generated in operation S300.

When operation S310 is 'NO', the adaptive biasing circuit may return to operation S300.

Figure 10:
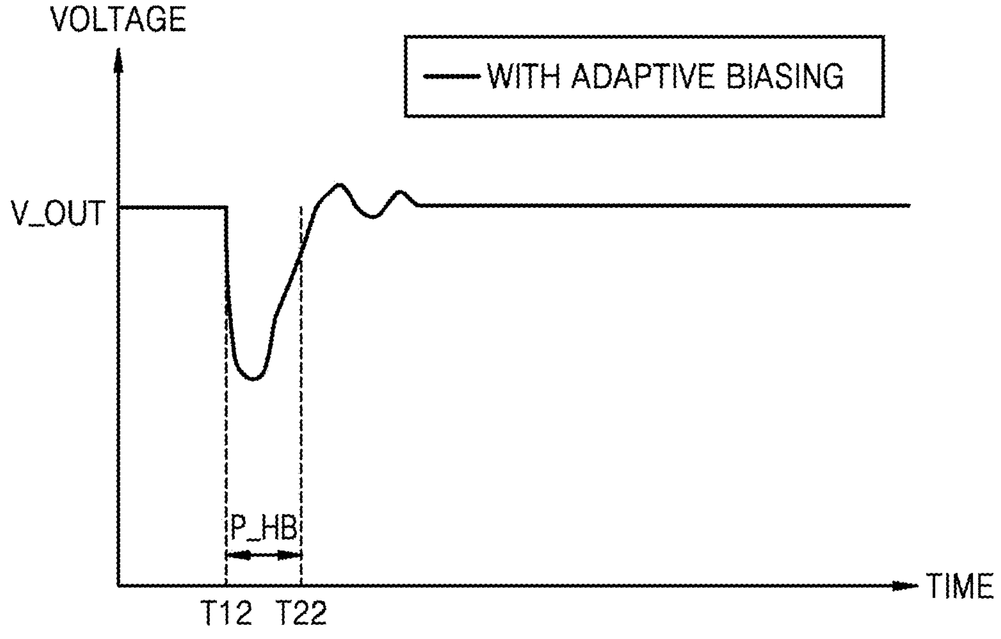
FIG. 10 is a diagram illustrating an operation of an example of an adaptive biasing circuit.

FIG. 10 is a diagram for describing operations of an example of an adaptive biasing circuit.

Referring to FIG. 10, in an occasion in which the output voltage V_OUT momentarily decreases, the output voltage V_OUT may be understood as a signal of a high frequency band due to fluctuation, and a high-frequency band period P_HB, in which the output voltage V_OUT corresponds to the signal of a high-frequency band, may be defined as a period between the time T12 and the time T22. In the high-frequency band period P_HB, in which the output voltage V_OUT that has rapidly dropped is to be rapidly recovered, the negative feedback operation of the voltage regulating circuit is important, and thus it may be required to minimize influences of the positive feedback operation of the adaptive biasing circuit.

Accordingly, the adaptive biasing circuit may be configured to sense the target current of the voltage regulating circuit, identify whether the target current corresponds to the high-frequency band period P_HB, and complement the sink current of the voltage regulating circuit only in the recovery period except the high-frequency band period P_HB.

Figure 11A:
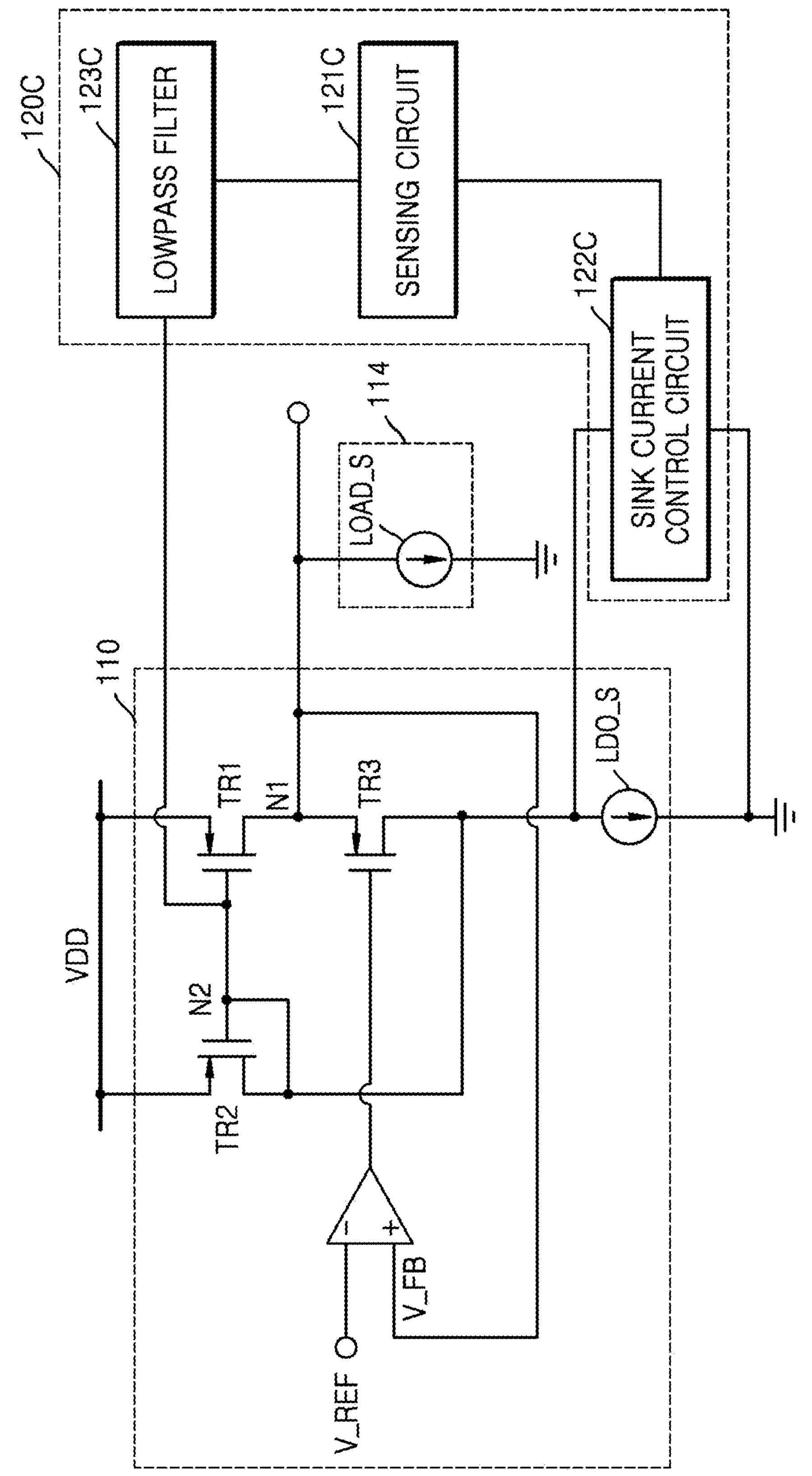
FIGS. 11A and 11B are diagrams schematically illustrating examples of an adaptive biasing circuit.
Figure 11B:
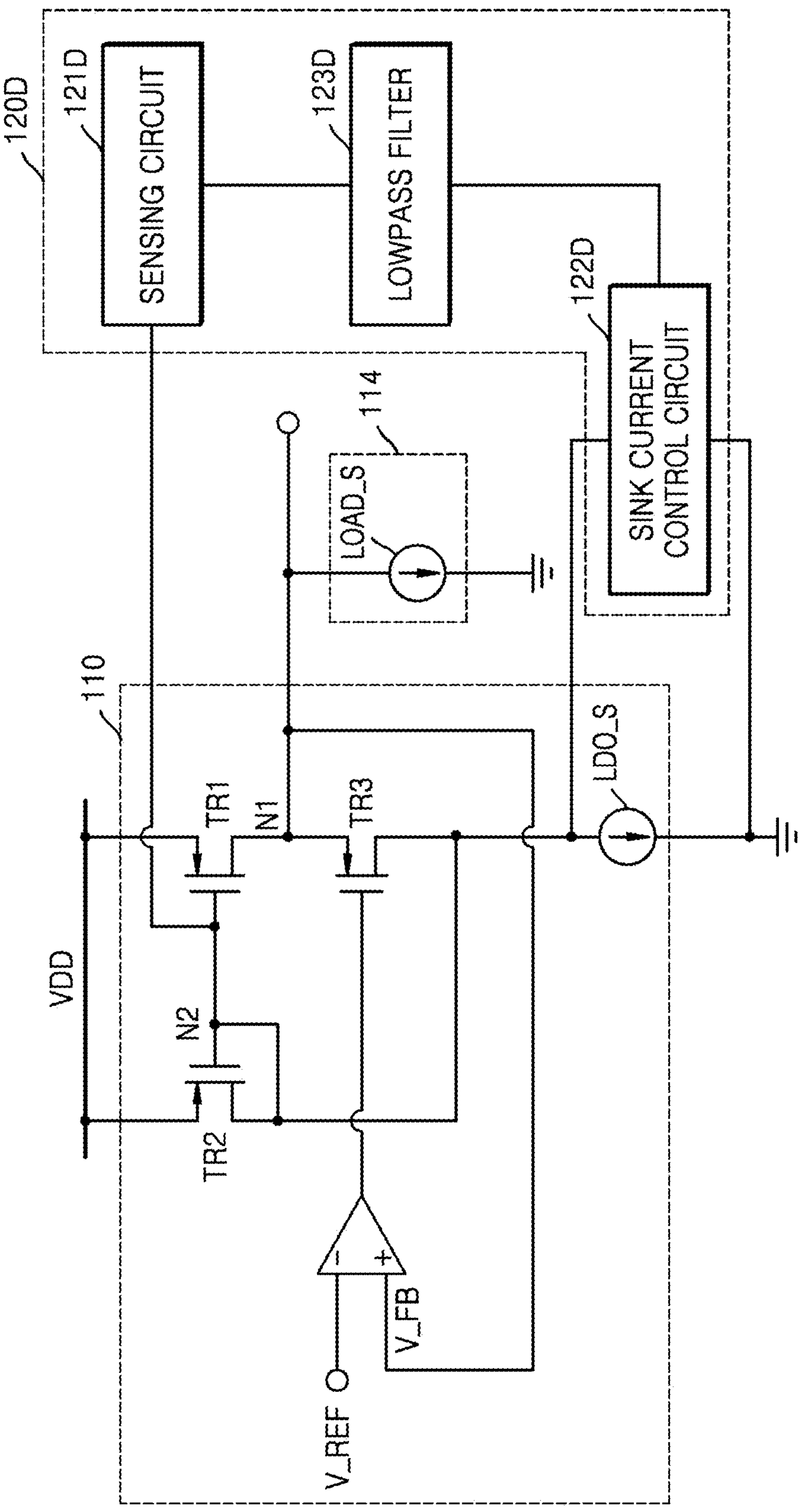

FIGS. 11A and 11B are diagrams schematically illustrating examples of adaptive biasing circuits 120D and 120E. It is assumed that the voltage regulating circuit 110 illustrated in FIGS. 11A and 11B and the voltage regulating circuit 110 illustrated in FIG. 3A are implemented in the same configuration, and the same descriptions as those given with reference to FIG. 3A are omitted.

Referring to FIG. 11A, the adaptive biasing circuit 120D may include a low-pass filter 123D, a sensing circuit 121D, and a sink current complementary circuit 122D.

In some implementations, the low-pass filter 123D may be configured to receive a voltage of the second node N2 of the voltage regulating circuit 110 and filter the received voltage. The low-pass filter 123D may be configured to transmit only signals corresponding to a certain low frequency band from the received voltage and provide the transmitted signal to the sensing circuit 121D.

In some implementations, a cut-off frequency of the low-pass filter 123D may be set according to the high-frequency band period P_HB illustrated in FIG. 10. In addition, the cut-off frequency of the low-pass filter 123D may be set based on characteristics of the load 114 related to the high-frequency band period P_HB, and as described above with reference to FIG. 7, the characteristics of the load 114 may include at least one of characteristics of the driving circuit and characteristics of the via included in the load 114. In the present specification, the cut-off frequency may correspond to a second parameter used when the adaptive biasing circuit 120C generates a biasing signal.

In some implementations, the sensing circuit 121D may be configured to generate a sensing signal based on a signal filtered from the low-pass filter 123D and provide the sensing signal to the sink current complementary circuit 122D.

For example, the sink current complementary circuit 122D may be configured to complement the sink current of the voltage regulating circuit 110 based on the sensing signal.

As described above, the adaptive biasing circuit 120D may be configured to complement the sink current of the voltage regulating circuit 110 through the low-pass filter 123D, avoiding the high-frequency band period P_HB illustrated in FIG. 10.

Further referring to FIG. 11B, compared with FIG. 11A, a low-pass filter 123E may be connected between a sensing circuit 121E and a sink current complementary circuit 122E and perform low-pass filtering with respect to an output of the sensing circuit 121E.

Although the adaptive biasing circuit 120C illustrated in FIG. 7 and the adaptive biasing circuit 120D illustrated in FIG. 11A are disclosed in different implementations, the implementations are not limited thereto and may be implemented in combination. For example, the adaptive biasing circuit may include both of the scaling circuit and the low-pass filter and therefore may be used for generating a biasing signal.

Figure 12:
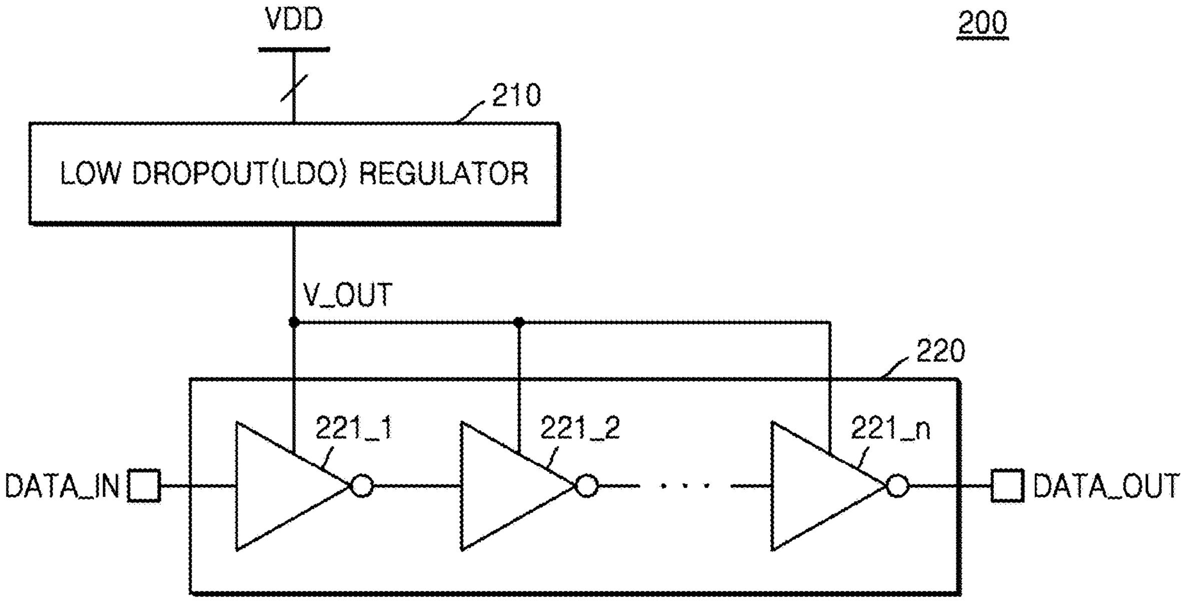
FIG. 12 is a block diagram for describing operations of an example of an LDO regulator.

FIG. 12 is a block diagram for describing operations of an example of an LDO regulator 210.

Referring to FIG. 12, the LDO regulator 210 may be configured to provide the output voltage V_OUT, which stably maintains the target level, as a supply voltage to a driving circuit 220.

In some implementations, the driving circuit 220 may include a plurality of inverters 221_1 to 221_*n* connected in series to one another and may be configured to generate output data DATA_OUT by gradually amplifying or buffering input data DATA_IN.

A value of at least one parameter related to generation of the biasing signal for supporting regulation with respect to the output voltage V_OUT of the adaptive biasing circuit included in the LDO regulator 210, may be set based on the characteristics of the driving circuit 220. In some implementations, the at least one parameter may include a first parameter related to the aforementioned scaling ratio and a second parameter related to the cut-off frequency of the aforementioned low-pass filter.

Figure 13:
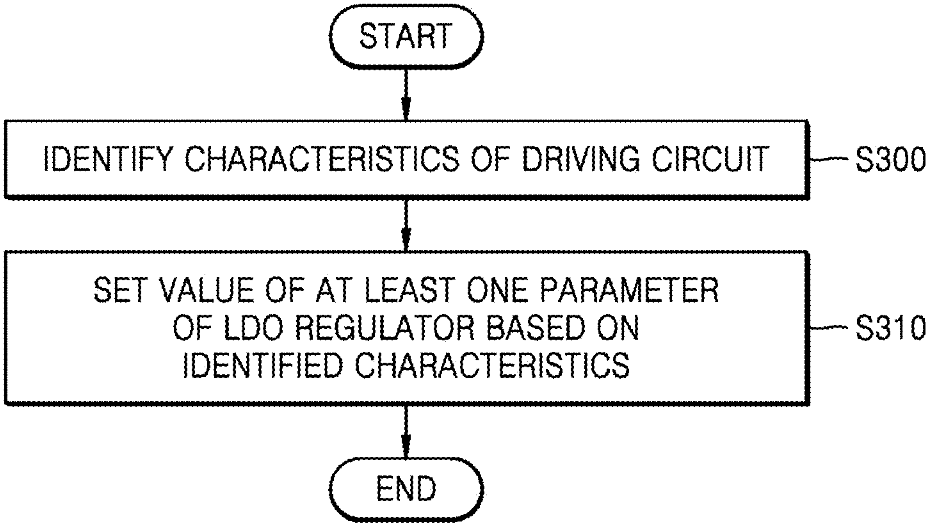
FIG. 13 is a flowchart illustrating an example of a method of operating a device configured to set parameters of an LDO regulator.

FIG. 13 is a flowchart illustrating an example of a method of operating a device configured to set parameters of an LDO regulator. The device may be configured to test a semiconductor device, which includes the LDO regulator and a driving circuit configured to receive the output voltage from the LDO regulator, and set values of various parameters.

Referring to FIG. 13, in operation S300, the device may confirm characteristics of the driving circuit connected to the LDO regulator. The device may be configured to monitor changes in the output voltage of the LDO regulator according to operations and characteristics of the driving circuit by applying test input data to the driving circuit. The device may be configured to confirm the characteristics of the driving circuit based on a result of the monitoring.

In operation S310, the device may set a value of at least one parameter of the LDO regulator based on the characteristics of the driving circuit confirmed in operation S300. In some implementations, the device may be configured to set a value of a parameter related to the operations of the adaptive biasing circuit of the LDO regulator, based on the characteristics of the driving circuit that have been confirmed.

Figure 14:
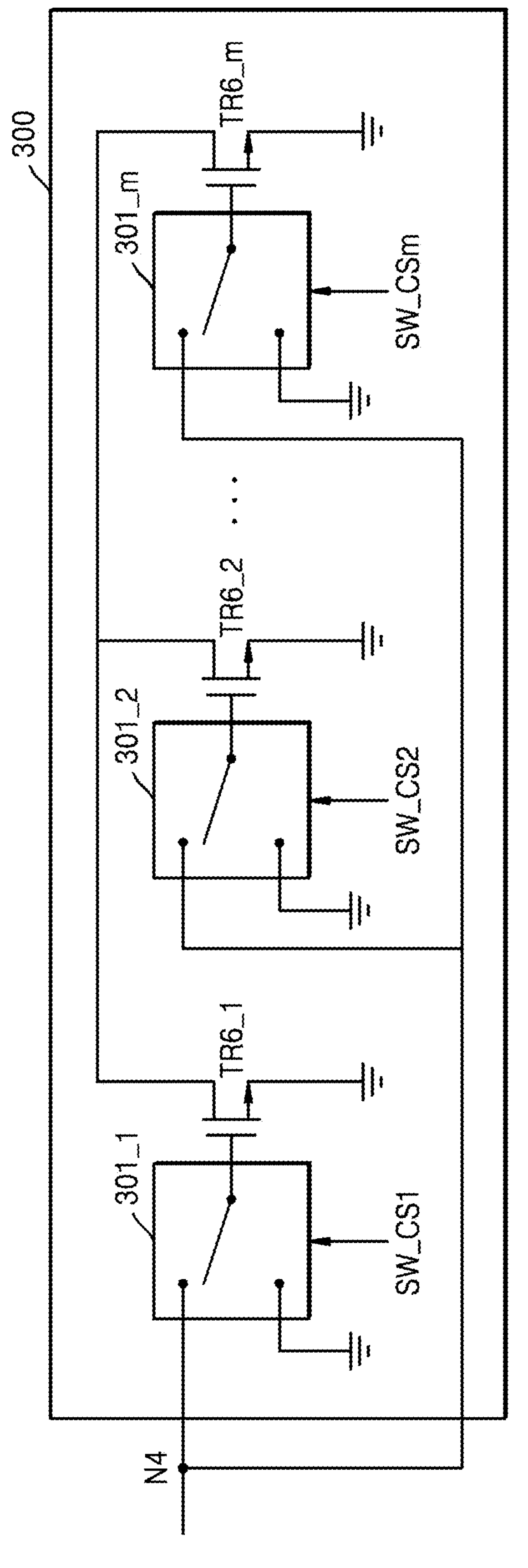
FIG. 14 is a circuit diagram of an example of an adaptive biasing circuit including a variable transistor.

FIG. 14 is a circuit diagram of an example of an adaptive biasing circuit including a variable transistor 300. An implementation example, in which the adaptive biasing circuit does not include an additional scaling circuit, unlike in FIG. 7, and in which the sixth transistor TR6 in FIG. 5 is substituted with the variable transistor 300, will be described with reference to FIG. 14.

Further referring to FIG. 14, the variable transistor may include a plurality of transistors TR6_1 to TR6_*m* and a plurality of switch elements 301_1 to 301_*m*.

In some implementations, the plurality of switch elements 301_1 to 301_*m* may connect the gate terminals of the plurality of transistors TR6_1 to TR6_*m* to the fourth node N4 or ground through a plurality of switch control signals SW_CS1 to SW_CSm.

In some implementations, by adjusting the number of transistors connected to the fourth node N4 among the plurality of transistors TR6_1 to TR6_*m*, the total width or the total length of the variable transistor 300 may be adjusted.

In some implementations, the number of transistors connected to the fourth node N4 among the plurality of transistors TR6_1 to TR6_*m* may be fixed, such as the first parameter related to the aforementioned scaling ratio, or may be adaptively modified. Furthermore, in some implementations, the number of transistors connected to the fourth node N4 among the plurality of transistors TR6_1 to TR6_*m* may be set according to the characteristics of the load to which the LDO regulator including the variable transistor 300 provides the output voltage.

In this way, the adaptive biasing circuit may be configured to adjust influences of the positive feedback operation on the output voltage of the LDO regulator through the variable transistor 300.

Figure 15:
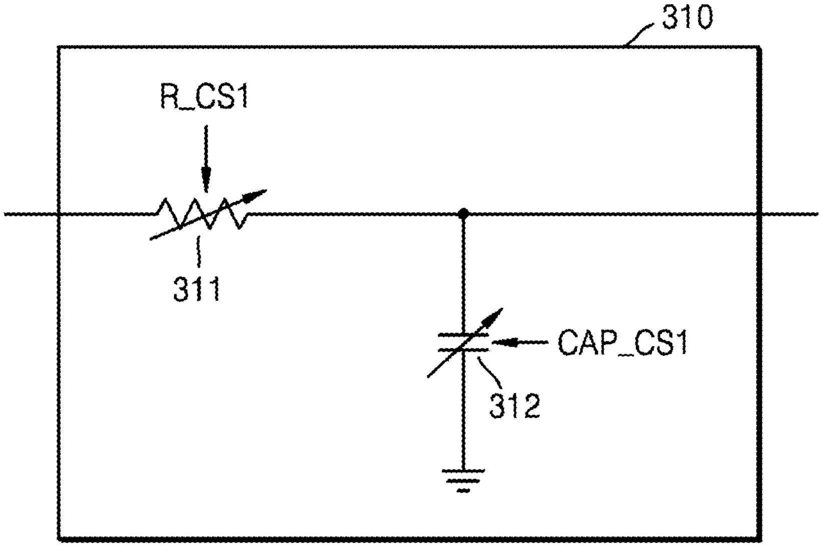
FIG. 15 is a circuit diagram of an example of an adaptive biasing circuit including a low-pass filter having a variable cutoff frequency.

FIG. 15 is a circuit diagram of an example of an adaptive biasing circuit including a low-pass filter 310 having a variable cutoff frequency. The low-pass filter 310 illustrated in FIG. 15 may be applied to the low-pass filters 123D and 123E illustrated in FIGS. 11A and 11B.

Referring to FIG. 15, the low-pass filter 310 may include a variable resistor 311 and a variable capacitor 312. A resistance value of the variable resistor 311 may be modified in response to a resistance value control signal R_CS, and a capacitance of the variable capacitor 312 may be modified in response to a capacitance control signal CAP_CS.

In some implementations, a cut-off frequency of the low-pass filter 310 may be regulated through at least one of modification of the resistance value of the variable resistor 311 and modification of the capacitance of the variable capacitor 312. In some implementations, the cut-off frequency of the low-pass filter 310 may be set according to the characteristics of the load to which the LDO regulator including the low-pass filter 310 provides the output voltage.

Figure 16:
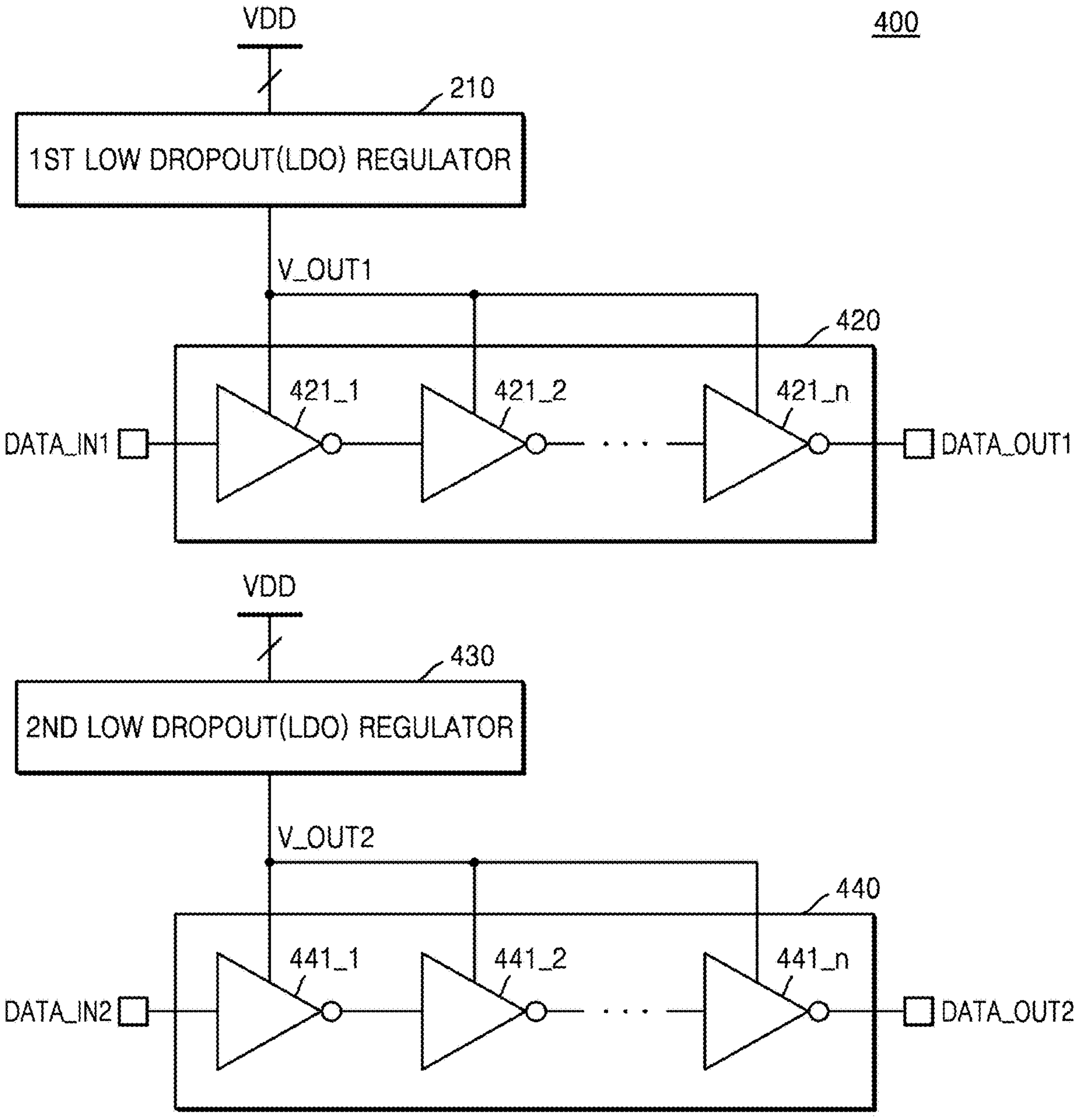
FIG. 16 is a block diagram illustrating example operations of a first LDO regulator and a second LDO regulator.

FIG. 16 is a block diagram for describing example operations of a first LDO regulator 410 and a second LDO regulator 430.

Referring to FIG. 16, the first regulator 410 may be configured to provide a first output voltage V_OUT1, which stably maintains the target level, to a first driving circuit 420. The first driving circuit 420 may include a plurality of first inverters 421_1 to 421_*n* connected in series to one another and may be configured to generate first output data DATA_OUT1 by gradually amplifying or buffering first input data DATA_IN1.

The second regulator 430 may be configured to provide a second output voltage V_OUT2, which stably maintains the target level, to a second driving circuit 440. The second driving circuit 440 may include a plurality of second inverters 441_1 to 441_*n* connected in series to one another and may be configured to generate the second output data DATA_OUT2 by gradually amplifying or buffering second input data DATA_IN2.

A value of at least one parameter related to generation of a first biasing signal for supporting regulation with respect to the first output voltage V_OUT1 of the first adaptive biasing circuit included in the first LDO regulator 410 may be set based on the characteristics of the first driving circuit 420.

A value of at least one parameter related to generation of a second biasing signal for supporting regulation with respect to the second output voltage V_OUT2 of the second adaptive biasing circuit included in the second LDO regulator 430 may be set based on the characteristics of the second driving circuit 440.

For example, when the first driving circuit 420 and the second driving circuit 440 have different characteristics, the first LDO regulator 410 and the second LDO regulator 430 may operate based on the parameters set as different values.

Figure 17:
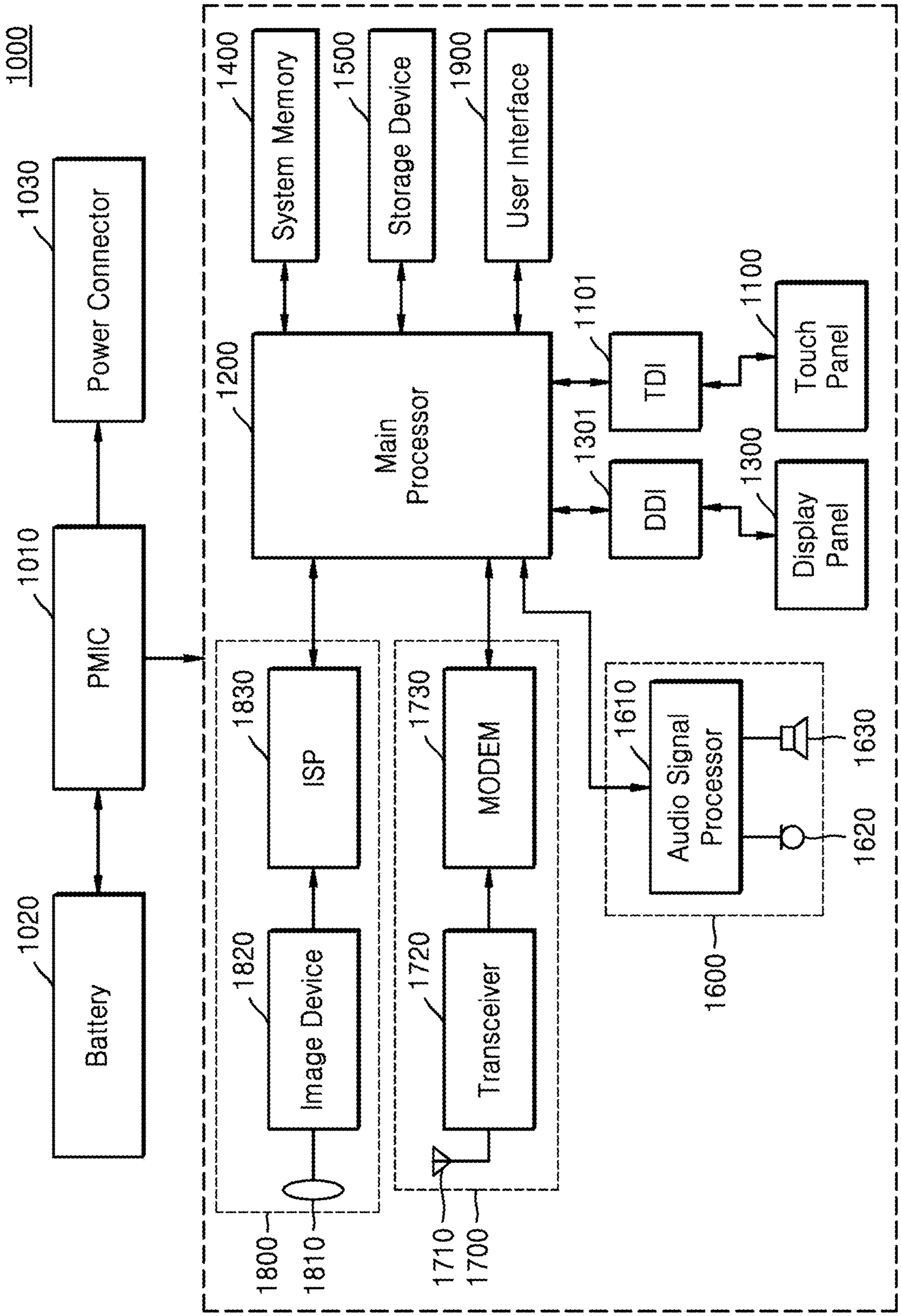
FIG. 17 is a block diagram of an example of an electronic device.

FIG. 17 is a block diagram of an example of an electronic device 1000.

Referring to FIG. 17, the electronic device 1000 may include a main processor 1200, a touch panel 1100, a touch driver integrated circuit (TDI) 1101, a display panel 1300, a display driver IC (DDI) 1301, a system memory 1400, a storage device 1500, an audio processor 1600, a communication block 1700, an image processor 1800, and a user interface 1900. In some implementations, the electronic device 1000 may include one of various electronic devices, e.g., personal computers, laptop computers, servers, workstations, portable communication terminals, Personal Digital Assistants (PDA), Portable Media Players (PMP), digital cameras, smartphones, tablet computers, and wearable devices.

The main processor 1700 may be configured to control general operations of the electronic device 1000. The main processor 1700 may be configured to control/manage operations of components of the electronic device 1000. The main processor 1700 may be configured to process various operations to drive the electronic device 1000. The touch panel 1100 may be configured to sense touch inputs from users in response to control of the TDI 1101. The display panel 1300 may be configured to display image information in response to control of the DDI 1301.

The system memory 1400 may be configured to store data used for the operations of the electronic device 1000. For example, the system memory 1400 may include volatile memory, e.g., static random access memory (SRAM), dynamic RAM (DRAM), synchronous DRAM (SDRAM), and/or nonvolatile memory, e.g., phase-change RAM (PRAM), magneto-resistive RAM (MRAM), resistive RAM (ReRAM), and ferro-electric RAM (FRAM).

The storage device 1500 may be configured to store data regardless of power supply. For example, the storage device 1500 may include at least one of various nonvolatile memory devices such as flash memory, PRAM, MRAM, ReRAM, and FRAM. For example, the storage device 1500 may include an embedded memory and/or a detachable memory of the electronic device 1000.

The audio processor 1600 may be configured to process audio signals by using the audio signal processor 1610. The audio processor 1600 may be configured to receive audio inputs through a microphone 1620 or provide audio outputs through a speaker 1630.

A communication block 1700 may exchange signals with external devices/systems through an antenna 1710. A transceiver 1720 and a modulator/demodulator (MODEM) 1730 of the communication block 1700 may be configured to process the signals exchanged with the external devices/systems, according to at least one of various wireless communication protocols such as Long Term Evolution (LTE), Worldwide Interoperability for Microwave Access (WiMax), Global System for Mobile communication (GSM), Code Division Multiple Access (CDMA), Bluetooth, Near Field Communication (NFC), Wireless Fidelity (Wi-Fi), Radio Frequency Identification (RFID), and the like.

The image processor 1800 may be configured to receive light through a lens 1810. An image device 1820 and an image signal processor (ISP) 1830 included in the image processor 1800 may be configured to generate image information regarding external objects based on the received light. The user interface 1900 may include an interface for exchange information with user, except the touch panel 1200, the display panel 1300, the audio processor 1600, and the image processor 1800. The user interface 1900 may include a keyboard, a mouse, a printer, a projector, various sensors, a body communication apparatus, and the like.

The electronic device 1000 may further include a power management IC (PMIC) 1010, a battery 1020, and a power connector 1030. The PMIC 1010 may be configured to generate internal power from power provided from the battery 1020 or power provided from the power connector 1030 and provide the internal power to the main processor 1700, the touch panel 1100, the TDI 1101, the display panel 1300, the DDI 1301, the system memory 1400, the storage device 1500, the audio processor 1600, the communication block 1700, the image processor 1800, and the user interface 1900.

The electronic device 1000 may include LDO regulators, and the LDO regulators may be connected to components in the electronic device 1000 and may perform regulating operations with respect to output voltages. By doing so, the components in the electronic device 1000 may stably receive power from the LDO regulators.

The PMIC 1010 may be configured to perform dynamic voltage scaling (DVS) on semiconductor integrated circuits. The PMIC 1010 may be configured to provide power voltages to the LDO regulators.

Alternatively, the electronic device 1000 may be implemented as various mobile devices, e.g., smartphones and smart pads. In addition, the electronic device 1000 may be implemented as various wearable devices, e.g., smartwatches, smart glasses, virtual reality (VR) goggles.

Figure 18:
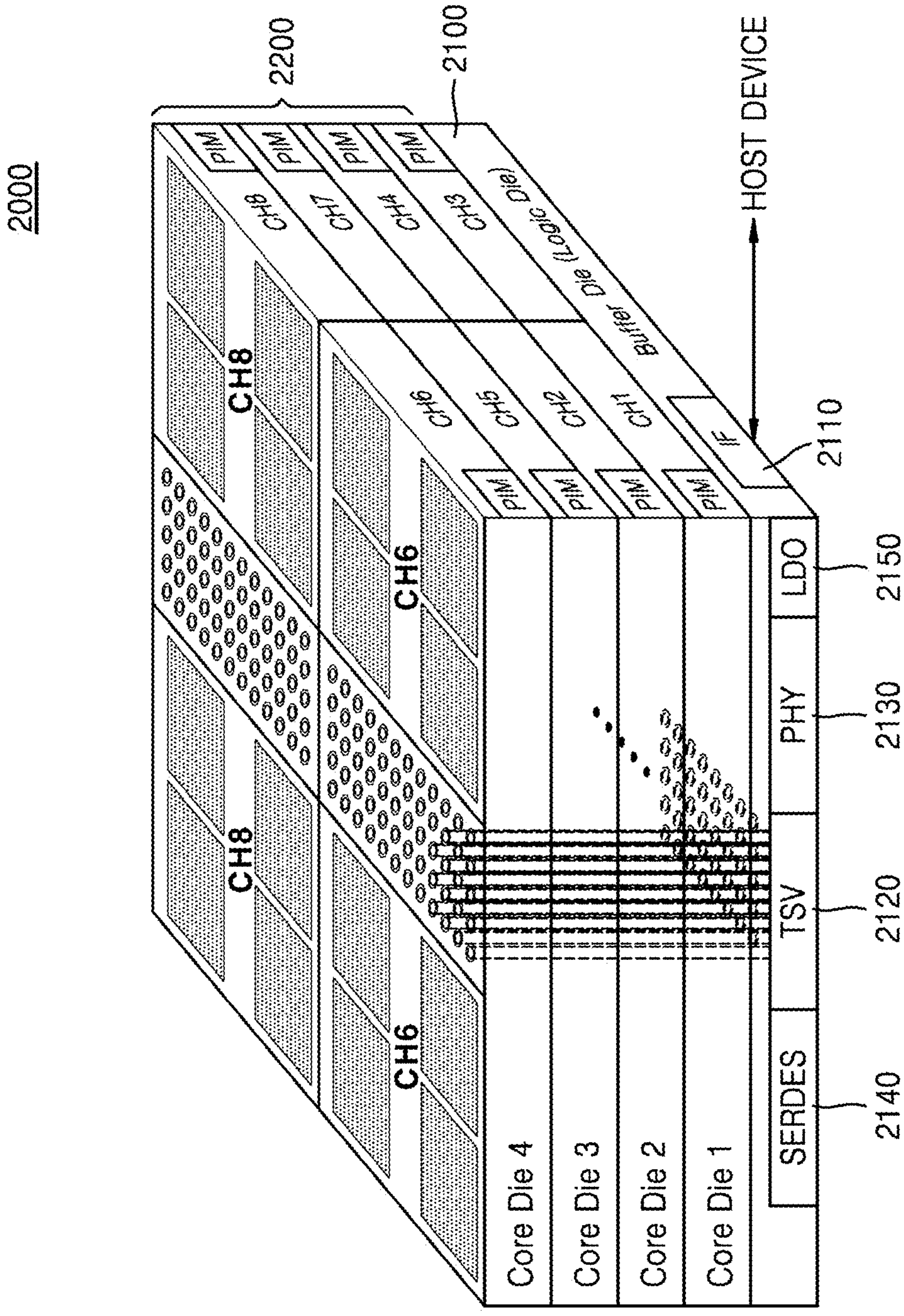
FIG. 18 is a diagram illustrating an example of a memory device.

FIG. 18 is a diagram illustrating an example of a memory device 2000. It is presumed that the memory device 2000 illustrated in FIG. 18 is implemented as a high bandwidth memory device.

Referring to FIG. 18, the memory device 2000 may have a high bandwidth by including a plurality of channels CH1 to CH8 respectively having independent interfaces. The memory device 2000 may include a plurality of dies, and for example, may include a buffer die 2100 (or a logic die) and one or more core dies 2200 stacked on the buffer die 2100. Although FIG. 18 illustrates an example in which four core dies 2200 including first to fourth core dies are provided in the memory device 2000, the number of core dies 2200 may be variously modified. The core dies 2200 may be referred to as memory dies.

The core dies 2200 may each include one or more channels. FIG. 18 illustrates an example in which each of the core dies 2200 includes two channels and thus the memory device 2000 includes eight channels, i.e., first to eighth channels CH1 to CH8. For example, the first core die may include the first channel CH1 and the third channel CH3, the second core die may include the second channel CH2 and the fourth channel CH4, the third core die may include the fifth channel CH5 and the fifth channel CH7, and the fourth core die may include the sixth channel CH6 and the eighth channel CH8.

The buffer die 2100 may include an interface circuit 2110 configured to communicate with a host device and may receive commands/addresses and input data from the host device through the interface circuit 2110. The host device may be configured to transmit commands/addresses and data through buses arranged to correspond to channels, may be formed such that buses are sorted according to channels, or some of the buses may be shared by at least two channels. The interface circuit 2110 may be configured to deliver command/address and input data to a channel to which the host device requests memory operations or operational processing.

In addition, the buffer die 2100 may further include a through silicon via (TSV) region 2120, a physical layer interface (PHY) region 2130, and a serializer/deserializer (SERDES) region 2140. The TSV region 2120 is a region in which a plurality of TSVs for communication with the core dies 2200 are formed. When each of the channels CH1 to CH8 has a bandwidth of 128 bits, the plurality of TSVs may include components for input/output of 1024-bit data.

The PHY region 2130 may include a plurality of input/output circuits for communication with the host device, and for example, the PHY region 2130 may include one or more ports for communication with the host device. The PHY region 2130 may include signals, frequency, timing, driving, detailed operation parameters, which are required for efficient communication between the host device and the memory device 2000, and physical or electrical hierarchies and logical hierarchies provided for the functionality. The PHY region 2130 may be configured to perform memory interfacing, e.g., selecting rows and columns corresponding to memory cells, writing data to the memory cells, or reading the data that has been written. The PHY region 2130 may be configured to support features of HBM protocols based on the JEDEC standard.

The SERDES region 2140 is a region to provide a SERDES interface based on the JEDEC standard in accordance with an increase in a processing throughput of processor(s) of the host device and an increase in requirements for memory bandwidths. The SERDES region 2140 may include a SERDES transmitter portion, a SERDES receiver portion, and a controller portion. The SERDES transmitter portion may include a parallel-to-serial circuit and a transmitter and may be configured to receive a parallel data stream and serialize the parallel data stream that has been received. The SERDES receiver portion may include a receiver amplifier, an equalizer, a clock and data restoring circuit, and a serial-to-parallel circuit and may be configured to receive a serial data stream and parallelize the serial data stream that has been received. The controller portion may include an error detection circuit, an error correction circuit, and resistors such as First In First Out (FIFO).

In some implementations, the interface circuit 2110 may include a plurality of driving circuits, and each of the driving circuits may be connected to at least one TSV from among the plurality of TSVs connected to the core dies 2200. In addition, the buffer die 2100 may include a plurality of LDO regulators 2150 to which the implementations are applied, and the plurality of LDO regulators 2150 may be connected to the plurality of driving circuits of the interface circuit 2110. In some implementations, the plurality of driving circuits may also be included in the PHY region 2130 or the SERDES region 2140.

For example, each of the plurality of LDO regulators 2150 may be configured to provide an output voltage to at least one of the plurality of driving circuits, and in the plurality of LDO regulators 2150, values of parameters for regulating the output voltage may be determined based on at least one of characteristics of the driving circuit to which the each of the plurality of LDO regulators 2150 provides the output voltage and characteristics of the TSV connected to the driving circuit. The parameters may include parameters related to operations of the adaptive biasing circuits included in the plurality of LDO regulator 2150.

The host device may be configured to provide the commands/addresses and input data such that at least some of a plurality of operations or kernels may be performed by the memory device 2000, and operational processing may be performed by the memory device 2000.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations, one or more features from a combination can in some cases be excised from the combination, and the combination may be directed to a subcombination or variation of a subcombination.

While the present disclosure has been particularly shown and described with reference to implementations thereof, it will be understood that various changes in form and details may be made therein without departing from the spirit and scope of the following claims.

What is claimed is:

1. A low dropout (LDO) regulator comprising:

a voltage regulating circuit configured to regulate an output voltage of an output node, the output node being connected with a load, the output voltage being used as first feedback; and an adaptive biasing circuit configured to generate a biasing signal configured to regulate the output voltage based on a sensing signal in an internal node of the voltage regulating circuit, the sensing signal being used as second feedback, and provide the biasing signal to the voltage regulating circuit;

wherein the voltage regulating circuit comprises:

a flipped voltage follower comprising a plurality of transistors; and a comparator configured to output, to the flipped voltage follower, a result of comparing the first feedback with a reference voltage; and wherein the adaptive biasing circuit comprises:

a sink current complementary circuit configured to generate, based on the sensing signal, the biasing signal complementing the sink current, the sink current flowing from the flipped voltage follower to the ground.

2. The LDO regulator of claim 1, wherein the voltage regulating circuit is configured to regulate the output voltage based on the first feedback being negative feedback, and wherein the adaptive biasing circuit is configured to generate the biasing signal based on the second feedback being positive feedback.

3. The LDO regulator of claim 2, wherein the adaptive biasing circuit is configured to limit the positive feedback on the output voltage to be less than the negative feedback on the output voltage.

4. The LDO regulator of claim 1, wherein the sensing signal comprises a signal related to a current that corresponds to a load current flowing from the output node to the load.

5. The LDO regulator of claim 1, wherein the biasing signal comprises a signal that complements a sink current, the sink current flowing from the voltage regulating circuit to ground.

6. The LDO regulator of claim 5, wherein the internal node is connected with, among the plurality of transistors, a gate terminal of a transistor, a current flowing through the transistor corresponds to a load current flowing from the output node to the load, and the adaptive biasing circuit further comprises:

a sensing circuit configured to sense a voltage of the internal node, and generate the sensing signal.

7. The LDO regulator of claim 6, wherein the adaptive biasing circuit comprises a scaling circuit configured downscale the sensing signal, and wherein the sink current complementary circuit is configured to generate the biasing signal based on the sensing signal that has been downscaled.

8. The LDO regulator of claim 7, wherein the scaling circuit is configured to scale the sensing signal at different scaling ratios in a first recovery period and a second recovery period, and, wherein, in the first recovery period and the second recovery period, the output voltage is recovered after being dropped due to the load.

9. The LDO regulator of claim 7, wherein the adaptive biasing circuit comprises a low-pass filter configured to perform low-frequency pass filtering with respect to a voltage of the internal node, and wherein the sensing circuit is configured to generate the sensing signal based on sensing the voltage of the internal node that has been filtered.

10. The LDO regulator of claim 1, wherein the load comprises a driving circuit configured to generate output data from input data, and wherein a value of at least one parameter is set based on a plurality of characteristics of the driving circuit, the at least one parameter being related to generation of the biasing signal of the adaptive biasing circuit.

11. The LDO regulator of claim 10, wherein the plurality of characteristics of the driving circuit comprises a plurality of characteristics of a plurality of vias, the plurality of vias being connected with the driving circuit and configured to deliver the output data.

12. A low dropout (LDO) regulator comprising:

a first node connected with a load and configured to provide an output voltage;

an LDO current source connected between a second node and ground and configured to drive a sink current;

a first current mirror comprising a first transistor and a second transistor that are connected with a power voltage terminal through a source terminal of each of the first transistor and the second transistor and with the second node through a gate terminal of each of the first transistor and the second transistor;

a third transistor sharing the first node with a drain terminal of the first transistor through a source terminal of the third transistor, the third transistor being connected with the second node through a drain terminal of the third transistor;

a comparator configured to output, to a gate terminal of the third transistor, a result of comparing an output voltage of the first node with a reference voltage; and an adaptive biasing circuit configured to generate an additional current to complement the sink current based on a sensing signal corresponding to a voltage of the second node, the additional current flowing from the second node to the ground.

13. The LDO regulator of claim 12, wherein the additional current is proportional to a magnitude of the sensing signal.

14. The LDO regulator of claim 12, wherein a current, flowing from the first node to the second node in a channel of the third transistor, is maintained within a threshold range in a recovery period according to the output voltage being dropped due to the load.

15. The LDO regulator of claim 12, wherein the adaptive biasing circuit is configured to downscale the sensing signal, and generate the additional current based on the sensing signal that has been downscaled.

16. The LDO regulator of claim 12, wherein the adaptive biasing circuit is configured to identify whether the sensing signal satisfies a plurality of adaptive biasing conditions, and generate the additional current based on a result of the identification.

17. The LDO regulator of claim 16, wherein the plurality of adaptive biasing conditions correspond to a plurality of conditions under which the sensing signal corresponds to a low-frequency band.

18. The LDO regulator of claim 12, wherein the adaptive biasing circuit comprises:

a second current mirror comprising a fourth transistor connected with the power voltage terminal through a source terminal of the fourth transistor, connected with the second node through a gate terminal of the fourth transistor, and connected with a fourth node through a drain terminal of the fourth transistor;

a fifth transistor connected with the fourth node through a gate terminal of the fifth transistor; and a sixth transistor connected with the fourth node through a gate terminal of the sixth transistor, wherein the sixth transistor is configured to copy a current to generate the additional current, the current flowing from the fourth node in a channel of the fifth transistor to the ground.

19. A memory device comprising:

a buffer die; and a plurality of core dies vertically stacked on the buffer die, the plurality of core dies being connected with the buffer die through a plurality of through silicon vias (TSVs), wherein the buffer die comprises a first driving circuit configured to generate first output data from first input data, and output the first output data to a first TSV among the plurality of TSVs; and a first low dropout (LDO) regulator configured to provide, as a first supply voltage, a first output voltage of a first output node to the first driving circuit, wherein the first LDO regulator comprises a first voltage regulating circuit configured to regulate the first output voltage of the first output node based on the first output voltage by using a comparator configured to compare a feedback voltage corresponding to the first output voltage with a reference voltage and output a comparison result, and a transistor configured to receive the comparison result through a gate terminal thereof; and a first adaptive biasing circuit configured to generate a first biasing signal configured to complement a sink current based on a first sensing signal in a first internal node of the first voltage regulating circuit, the sink current flowing toward ground through a channel of the transistor.

* * * * *